(12) United States Patent
Koyama et al.

(10) Patent No.: US 8,053,717 B2
(45) Date of Patent: Nov. 8, 2011

(54) PHOTOELECTRIC CONVERSION DEVICE HAVING A REFERENCE VOLTAGE GENERATION CIRCUIT WITH A RESISTOR AND A SECOND DIODE ELEMENT AND ELECTRONIC DEVICE HAVING THE SAME

(75) Inventors: Jun Koyama, Kanagawa (JP); Atsushi Hirose, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 395 days.

(21) Appl. No.: 12/465,335

(22) Filed: May 13, 2009

(65) Prior Publication Data

US 2009/0289173 A1    Nov. 26, 2009

(30) Foreign Application Priority Data

May 22, 2008  (JP) ................................ 2008-134663

(51) Int. Cl.
*H01J 40/14*        (2006.01)

(52) U.S. Cl. .............................. 250/214 R; 250/214 LA

(58) Field of Classification Search .............. 250/214 R, 250/214 A, 214 LA; 327/514, 108, 509; 257/443, 239, 355, 292
See application file for complete search history.

(56) References Cited

U.S. PATENT DOCUMENTS

| 5,936,231 | A |   | 8/1999 | Michiyama et al. |
| 6,031,219 | A | * | 2/2000 | Shuke ........................ 250/214 R |
| 6,417,656 | B1 |   | 7/2002 | Shirai |
| 7,253,391 | B2 |   | 8/2007 | Koyama et al. |
| 2006/0227231 | A1 |   | 10/2006 | Okada |
| 2007/0267665 | A1 |   | 11/2007 | Koyama et al. |

FOREIGN PATENT DOCUMENTS

| JP | 09-329493 | 12/1997 |
| JP | 2005-129909 | 5/2005 |
| JP | 2006-294682 | 10/2006 |

* cited by examiner

*Primary Examiner* — Que T Le
(74) *Attorney, Agent, or Firm* — Nixon Peabody, LLP; Jeffrey L. Costellia

(57) ABSTRACT

The photoelectric conversion device includes a photoelectric conversion circuit for outputting photocurrent generated in a photoelectric conversion element as output voltage subjected to logarithmic compression by a first diode element, a reference voltage generation circuit for outputting reference voltage subjected to logarithmic compression by a second diode element in accordance with the amount of current flowing to a resistor, an arithmetic circuit for outputting an output signal obtained by amplifying a difference between the output voltage output from the photoelectric conversion circuit and the reference voltage output from the reference voltage generation circuit, and an output circuit for outputting current corresponding to the logarithmically-compressed output voltage output from the photoelectric conversion circuit by the output signal.

22 Claims, 23 Drawing Sheets

1702a, 1702b, 1702d, 1702, 1702c, 1702e

1702a | 1702b | 1702c | 1700 1701 | 1702d | 1702e diode element | TFT and photodiode | terminal portion | resistor | capacitor 1703a 1703e 1703a 1703e diode element | TFT and photodiode | terminal portion | resistor | capacitor

1910

| diode element | TFT and photodiode | terminal portion | resistor | capacitor |

2006

| diode element | TFT and photodiode | terminal portion | resistor | capacitor |

PHOTOELECTRIC CONVERSION DEVICE HAVING A REFERENCE VOLTAGE GENERATION CIRCUIT WITH A RESISTOR AND A SECOND DIODE ELEMENT AND ELECTRONIC DEVICE HAVING THE SAME

BACKGROUND OF THE INVENTION

1. Field of the Invention

The present invention relates to photoelectric conversion devices and electronic devices having the photoelectric conversion devices. In particular, the present invention relates to photoelectric conversion devices in which output signals are logarithmically converted and electronic devices having the photoelectric conversion devices.

2. Description of the Related Art

A large number of photoelectric conversion devices generally used for detecting electromagnetic waves are known. For example, photoelectric conversion devices having sensitivity to ultraviolet rays to infrared rays are generally referred to as optical sensors. Among optical sensors, an optical sensor having sensitivity to a visible light region with a wavelength greater than or equal to 400 nm and less than or equal to 700 nm is particularly referred to as a visible light sensor. A large number of visible light sensors are used for devices which need illuminance adjustment, on/off control, or the like depending on human living environment.

In some display devices, ambient brightness of the display devices is detected so that display luminance is adjusted. This is because with optical sensors, visibility can be improved or wasted power consumption can be reduced by detecting ambient brightness and obtaining appropriate display luminance. For example, examples of display devices having optical sensors for adjusting luminance are mobile phones, computers provided with display portions, and the like. In addition, not only ambient brightness of the display portions but also the luminance of display devices, in particular, the luminance of backlights of liquid crystal display devices is detected with optical sensors so that the luminance of display screens is adjusted.

An optical sensor, which is a photoelectric conversion device, uses a photoelectric conversion element such as a photodiode for a light sensing portion, supplies photocurrent generated in the photoelectric conversion element to a resistor, and can detect light intensity in accordance with obtained output voltage (see Reference 1). Further, the photocurrent generated in the photoelectric conversion element is amplified in an amplifier circuit so that weak light is detected. A current mirror circuit is used as the amplifier circuit, for example (see Reference 2).

In a photoelectric conversion device disclosed in Reference 2, when light intensity of weak light to strong light is to be detected, the range of photocurrent amplified is wider. Therefore, in the case where photocurrent amplified by external load resistance or the like is converted into voltage, output voltage increases linearly with respect to illuminance. Accordingly, when output voltage is to be obtained in a wide illuminance range, several milli-volts are obtained in the case of weak light, and several volts are obtained in the case of strong light. Thus, due to limitations on a circuit (e.g., power supply voltage), it is difficult to broaden the dynamic range of illuminance as an optical sensor.

Meanwhile, in order to broaden the dynamic range of illuminance in a photoelectric conversion device, output having the level of voltage subjected to logarithmic compression (hereinafter referred to as output voltage) is obtained by supplying photocurrent generated in a photoelectric conversion element to a diode element (see Reference 3). Note that logarithmic compression refers to a technique by which the amount of output current or the level of output voltage is obtained as a logarithmic function with the illuminance of light which enters a photoelectric conversion element, i.e., the amount of photocurrent used as a variable.

REFERENCE

Reference 1: Japanese Published Patent Application No. 2005-129909

Reference 2: Japanese Patent No. 3444093

Reference 3: Japanese Published Patent Application No. 2006-294682

SUMMARY OF THE INVENTION

In the photoelectric conversion device disclosed in Reference 3, the dynamic range of illuminance can be broadened by the diode element without increasing the resistance value of external load resistance. However, in the case where the logarithmic compression of illuminance is performed using the diode element, there is a problem in that the level of output voltage fluctuates due to the temperature dependence of the diode element and that accurate output voltage cannot be obtained. Further, in the photoelectric conversion device disclosed in Reference 3, even in the case where weak light which is less than the lower limit of detection is detected using the photoelectric conversion element, the output voltage is amplified; thus, there is a problem in that desired output voltage cannot be obtained.

It is an object of an embodiment of the present invention to provide a photoelectric conversion device in which output voltage can be obtained by reducing the adverse effect of the temperature dependence of a diode element even in a condition where temperature changes greatly. It is an object of an embodiment of the present invention to provide a photoelectric conversion device which can be operated with the level of output voltage or the amount of output current used as the level of voltage in the lower limit of detection or the amount of current less than the lower limit of detection even in a condition where weak light which is less than the lower limit of detection of a photoelectric conversion element is detected.

In order to solve the foregoing problems, an embodiment of the present invention includes a photoelectric conversion circuit for outputting photocurrent generated in a photoelectric conversion element as output voltage subjected to logarithmic compression by a first diode element, a reference voltage generation circuit for outputting reference voltage subjected to logarithmic compression by a second diode element in accordance with the amount of current flowing to a resistor, an arithmetic circuit for outputting an output signal obtained by amplifying a difference between the output voltage output from the photoelectric conversion circuit and the reference voltage output from the reference voltage generation circuit, and an output circuit for outputting current corresponding to the logarithmically-compressed output voltage output from the photoelectric conversion circuit by the output signal.

An embodiment of the present invention is a photoelectric conversion device which includes a photoelectric conversion circuit having a photoelectric conversion element and outputting first voltage generated in one of terminals of a first diode element in accordance with the amount of photocurrent generated in the photoelectric conversion element, a reference voltage generation circuit having a resistor and outputting second voltage generated in one of terminals of a second diode element in accordance with the amount of current flowing to the resistor, an arithmetic circuit for outputting an output signal obtained by amplifying a difference between a signal corresponding to the first voltage and a signal corresponding to the second voltage, and an output circuit for outputting current corresponding to the first voltage by the output signal.

An embodiment of the present invention is a photoelectric conversion device which includes a photoelectric conversion circuit having a photoelectric conversion element and outputting first voltage generated in one of terminals of a first diode element in accordance with the amount of photocurrent generated in the photoelectric conversion element, a reference voltage generation circuit having a resistor and outputting second voltage generated in one of terminals of a second diode element in accordance with the amount of current flowing to the resistor, an arithmetic circuit having an operational amplifier in which a signal corresponding to the first voltage is input to an inverting input terminal and a signal corresponding to the second voltage is input to a non-inverting input terminal and outputting an output signal from the operational amplifier, and an output circuit for outputting current corresponding to the first voltage by the output signal.

An embodiment of the present invention is a photoelectric conversion device which includes a photoelectric conversion circuit having a photoelectric conversion element and outputting first voltage generated in one of terminals of a first diode element in accordance with the amount of photocurrent generated in the photoelectric conversion element, a reference voltage generation circuit having a resistor and outputting second voltage generated in one of terminals of a second diode element in accordance with the amount of current flowing to the resistor, an arithmetic circuit having an operational amplifier in which a signal corresponding to the first voltage is input to an inverting input terminal and a signal corresponding to the second voltage is input to a non-inverting input terminal and outputting an output signal from the operational amplifier, a current mirror circuit, and an output circuit. The output circuit includes an n-channel transistor and a p-channel transistor. A first terminal of the n-channel transistor is electrically connected to the current mirror circuit, and a second terminal of the n-channel transistor is electrically connected to the inverting input terminal of the operational amplifier. A first terminal of the p-channel transistor is electrically connected to the inverting input terminal of the operational amplifier, and a second terminal of the p-channel transistor is electrically connected to a wiring for applying a low power supply potential. The output circuit switches a conduction state and a non-conduction state by inputting the output signal to a gate of the n-channel transistor and a gate of the p-channel transistor.

An embodiment of the present invention is a photoelectric conversion device which includes a photoelectric conversion circuit having a photoelectric conversion element and outputting first voltage generated in one of terminals of a first diode element in accordance with the amount of photocurrent generated in the photoelectric conversion element, a reference voltage generation circuit having a resistor and outputting second voltage generated in one of terminals of a second diode element in accordance with the amount of current flowing to the resistor, a first amplifier circuit for amplifying the first voltage, a second amplifier circuit for amplifying the second voltage, an arithmetic circuit having an operational amplifier in which the amplified first voltage is input to an inverting input terminal and the amplified second voltage is input to a non-inverting input terminal and outputting an output signal from the operational amplifier, a current mirror circuit, and an output circuit. The output circuit includes an n-channel transistor and a p-channel transistor. A first terminal of the n-channel transistor is electrically connected to the current mirror circuit, and a second terminal of the n-channel transistor is electrically connected to the inverting input terminal of the operational amplifier. A first terminal of the p-channel transistor is electrically connected to the inverting input terminal of the operational amplifier, and a second terminal of the p-channel transistor is electrically connected to a wiring for applying a low power supply potential. The output circuit switches a conduction state and a non-conduction state by inputting the output signal to a gate of the n-channel transistor and a gate of the p-channel transistor.

In the above embodiment of the photoelectric conversion device of the present invention, the other of the terminals of the first diode element and the other of the terminals of the second diode element may be electrically connected to a wiring for applying a high power supply potential.

In the photoelectric conversion device of the present invention, the resistor may have a resistance value for supplying current when irradiation with light having illuminance higher than or equal to illuminance which can be detected by the photoelectric conversion element is performed.

In the above embodiment of the photoelectric conversion device of the present invention, each of the first amplifier circuit and the second amplifier circuit may be formed using a source follower circuit.

In the above embodiment of the photoelectric conversion device of the present invention, the photoelectric conversion element may be a photodiode.

In the above embodiment of the photoelectric conversion device of the present invention, each of the first diode element and the second diode element may be a PIN diode element.

In the above embodiment of the photoelectric conversion device of the present invention, the first diode element and the second diode element may be provided adjacent to each other.

According to the above embodiment of the present invention, a photoelectric conversion device can be obtained in which fluctuation in the first voltage due to the temperature dependence of a diode element for logarithmic compression can be suppressed. Further, according to the embodiment of the present invention, even in the case where weak light which is less than the lower limit of detection of a photoelectric conversion element is detected, a constant output signal can be obtained.

BRIEF DESCRIPTION OF THE DRAWINGS

In the accompanying drawings:
FIGS. 13A and 131B are graphs for illustrating Embodiment 2.

DETAILED DESCRIPTION OF THE INVENTION

Figure 1:
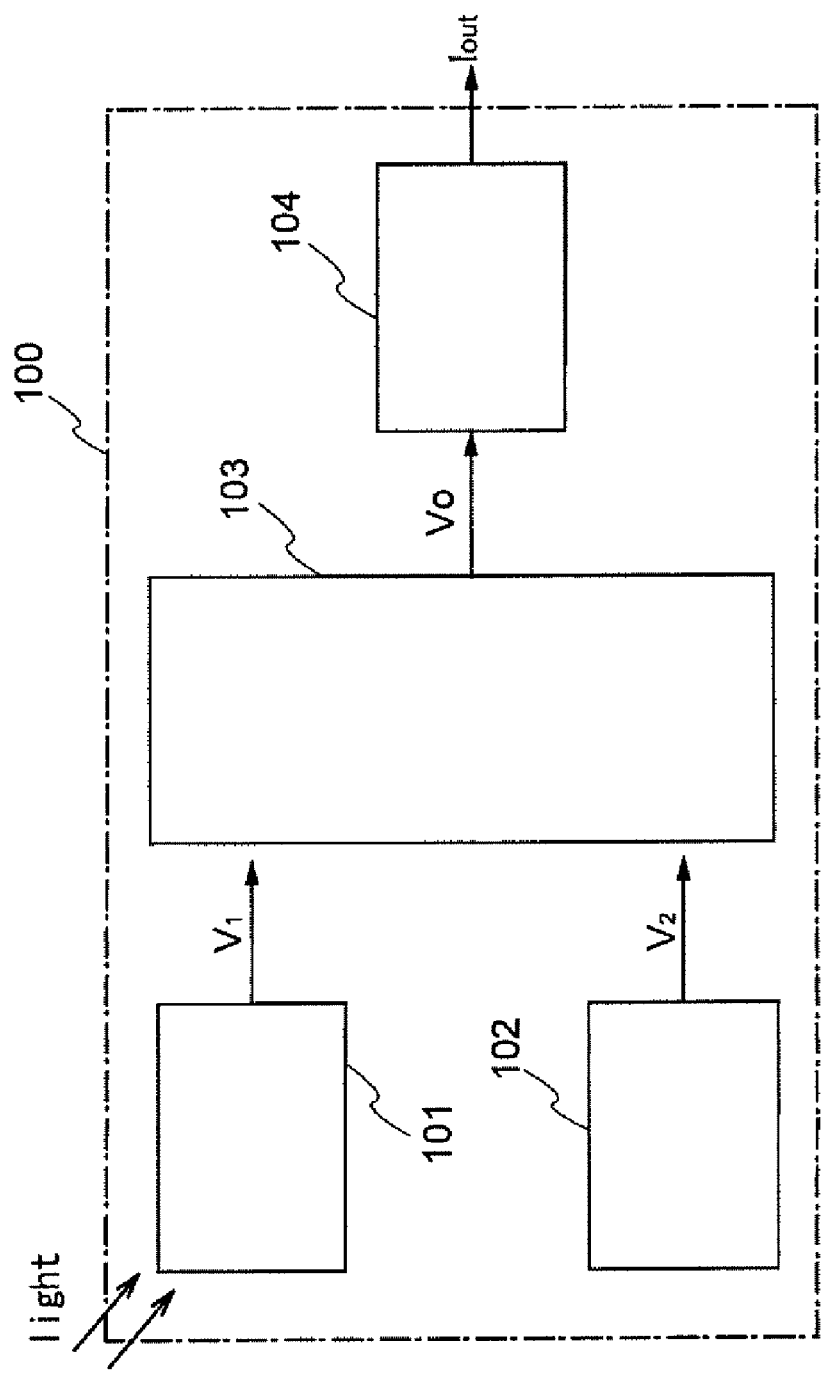
FIG. 1 is a block diagram for illustrating Embodiment 1.

Hereinafter, embodiments of the present invention will be described with reference to the drawings. Note that the present invention can be implemented in various different ways and it will be readily appreciated by those skilled in the art that various changes and modifications are possible without departing from the spirit and the scope of the present invention. Therefore, the present invention should not be construed as being limited to the following description of the embodiments. Note that in all the drawings for describing the embodiments, the same portions or portions having similar functions are denoted by the same reference numerals, and description thereof is not repeated.

Embodiment 1

In this embodiment, the structure and the operation of a photoelectric conversion device of the present invention are described. Note that in the photoelectric conversion device of the present invention, which is described in this embodiment, a signal related to the amount of incident light, which is obtained from a photoelectric conversion element, is converted into a signal subjected to logarithmic compression and is output outside.

First, a block diagram of a photoelectric conversion device is described. A photoelectric conversion device 100 illustrated in FIG. 1 includes a photoelectric conversion circuit 101, a reference voltage generation circuit 102, an arithmetic circuit 103, and an output circuit 104. The photoelectric conversion circuit 101 is a circuit for outputting first voltage $V_1$ subjected to logarithmic compression by one of terminals of a first diode element in accordance with photocurrent flowing to a photoelectric conversion element. In addition, the reference voltage generation circuit 102 is a circuit for outputting second voltage $V_2$ (also referred to as reference voltage) subjected to logarithmic compression by one of terminals of a second diode element in accordance with current flowing to a resistor. Further, the arithmetic circuit 103 is a circuit for outputting an output signal $V_O$ obtained by amplifying a difference between the first voltage $V_1$ and the second voltage $V_2$. The output circuit 104 is a circuit for outputting current $I_{out}$ corresponding to the amount of the output signal $V_O$.

Note that in this specification, terms such as "first", "second", "third", and "$N^{th}$" (N is a natural number) are used in order to avoid confusion among components, and the terms do not limit the components numerically.

Note that in this specification, when it is described that "A and B are connected to each other", the case where A and B are electrically connected to each other is included in addition to the case where A and B are directly connected to each other. Here, when it is described that "A and B are electrically connected to each other", the case where A and B have the same or substantially the same nodes with an object interposed therebetween when the object having any electrical function is interposed between A and B is included.

Specifically, the case where it is acceptable that A and B have the same nodes considering a circuit operation, for example, the case where A and B are connected to each other with a switching element such as a transistor interposed therebetween and have the same or substantially the same potentials by the conduction of the switching element, the case where A and B are connected to each other with a resistor interposed therebetween and a potential difference generated at opposite ends of the resistor does not adversely affect the operation of a circuit including A and B, or the like is included.

Figure 2:
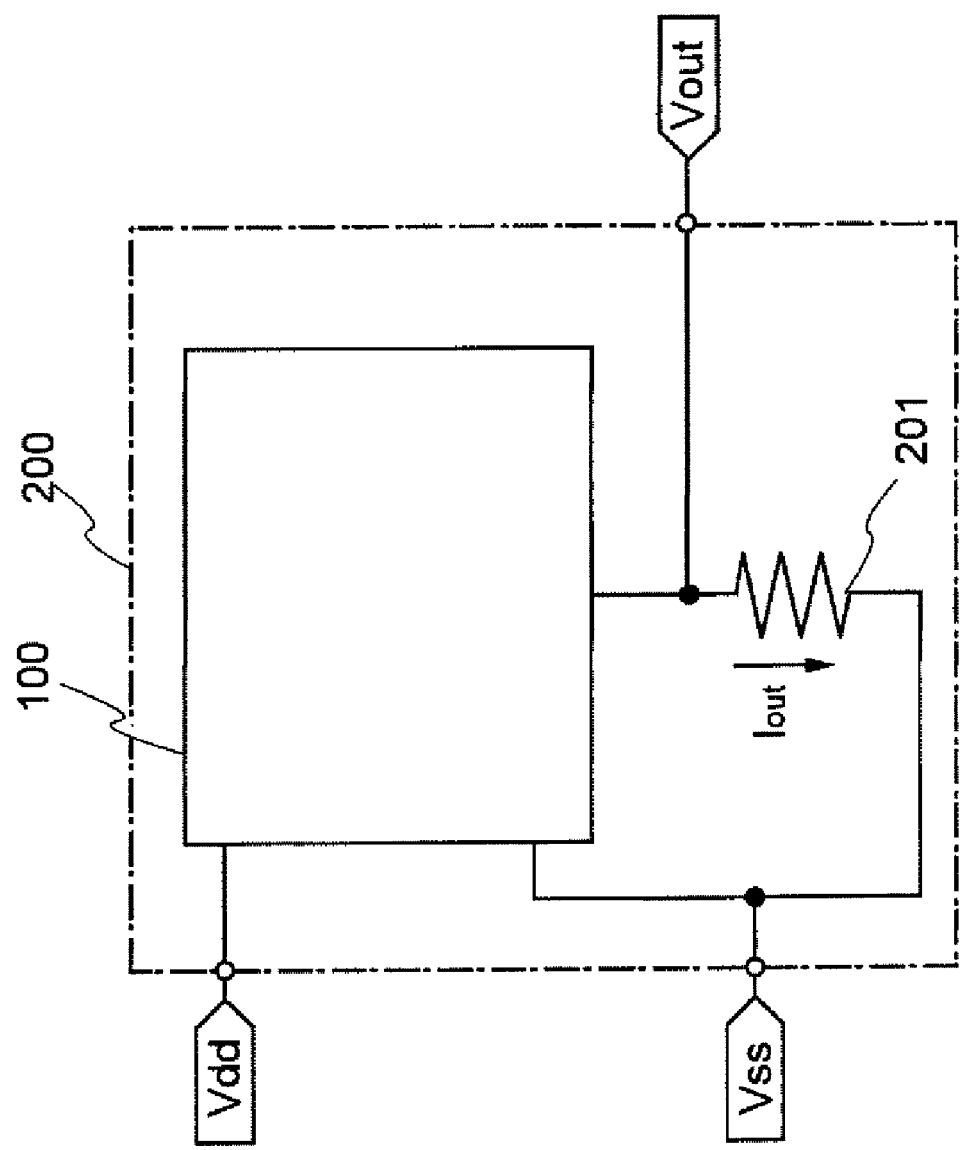
FIG. 2 is a circuit diagram for illustrating Embodiment 1.

Terminals or wirings for applying a high power supply potential Vdd and a low power supply potential Vss are electrically connected to the photoelectric conversion device 100, as illustrated in FIG. 2. In this embodiment, the photoelectric conversion device 100 is a circuit for outputting the current $I_{out}$ corresponding to photocurrent. Thus, in order to obtain output with voltage, an external resistor is provided. Accordingly, voltage $V_{out}$ can be obtained as output, Note that by providing an internal resistor 201 in a photoelectric conversion device 200 as illustrated in FIG. 2, the voltage $V_{out}$ can be obtained as output to the outside.

Next, an example of the specific circuit structure of the photoelectric conversion circuit 101 illustrated in FIG. 1 is described. The photoelectric conversion circuit 101 illustrated in FIG. 3 includes a photoelectric conversion element 301, a current mirror circuit 302, and a first diode element 303. The current mirror circuit 302 includes a first n-channel transistor 304 and a second n-channel transistor 305. The high power supply potential (Vdd) is applied to one of terminals (cathode side) of the photoelectric conversion element 301. The other of the terminals (anode side) of the photoelectric conversion element 301 is electrically connected to the input side of the current mirror circuit 302. Gate terminals of the first n-channel transistor 304 and the second n-channel transistor 305 in the current mirror circuit 302 are electrically connected to each other. A first terminal of the first n-channel transistor 304 is electrically connected to the gate terminals of the first n-channel transistor 304 and the second n-channel transistor 305. The low power supply potential (Vss) is applied to second terminals of the first n-channel transistor 304 and the second n-channel transistor 305. One of terminals (cathode side) of the first diode element 303 is electrically connected to a first terminal of the second n-channel transistor 305. The high power supply potential Vdd is applied to the other of the terminals (anode side) of the first diode element 303.

As the photoelectric conversion element, a PN or PIN photodiode, a phototransistor, or the like may be used so that photocurrent corresponding to the amount of incident light is obtained. Note that in this specification, a structure where a PIN photodiode is used as the photoelectric conversion element is described. A PIN photodiode is preferable because the response characteristics of a depletion layer to irradiation with light is better than that of a PN photodiode.

Figure 3:
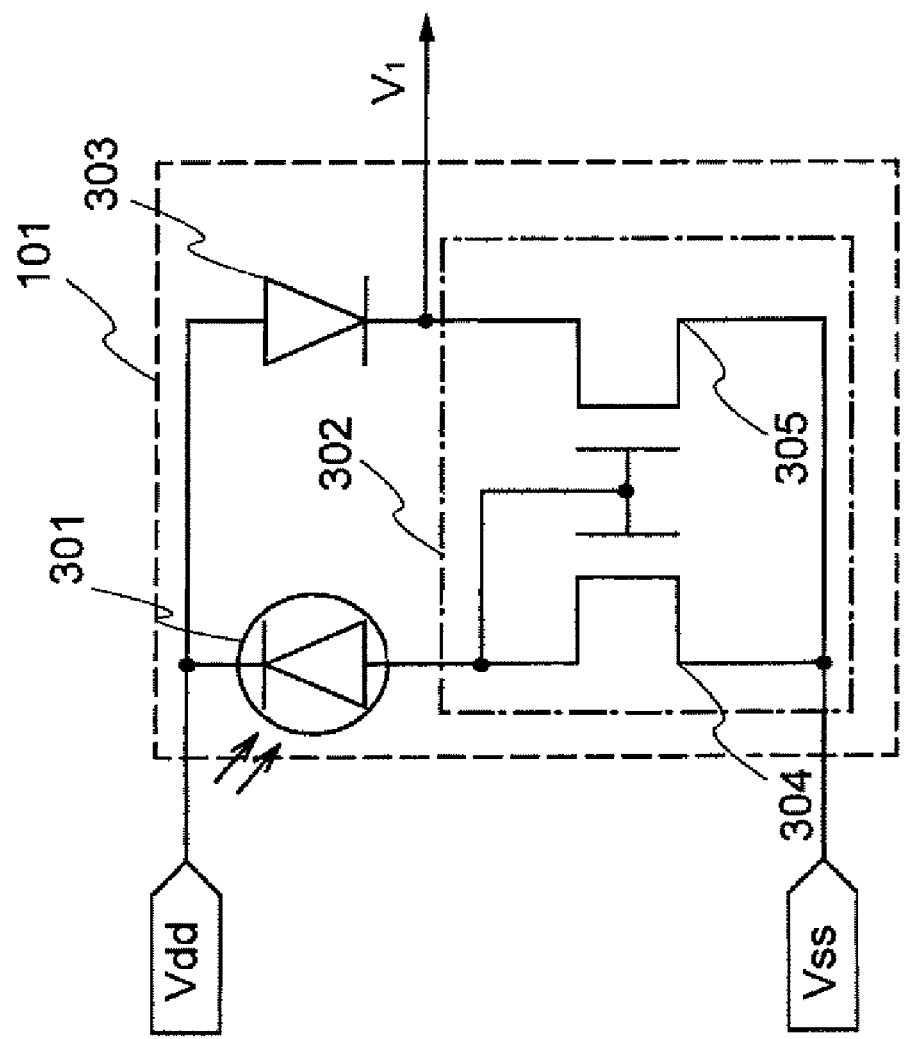
FIG. 3 is a circuit diagram for illustrating Embodiment 1.

The operation of the photoelectric conversion circuit 101 illustrated in FIG. 3 is briefly described. When the photoelectric conversion element 301 is irradiated with light, photocurrent $I_L$ is generated. The photocurrent $I_L$ flows between the first terminal (drain) and the second terminal (source) of the first n-channel transistor 304. In a similar manner, current corresponding to the photocurrent $I_L$ flows between the first terminal (drain) and the second terminal (source) of the second n-channel transistor 305. In this case, the current flowing through the second n-channel transistor 305 flows to the first diode element 303. The voltage-current characteristics of the first diode element 303 is expressed as Formula 1.

[Formula 1]

$$I_L = I_S \exp\left(\frac{q\Delta V_1}{kT} - 1\right) \quad (1)$$

Note that in this embodiment, for illustrative purposes, the photocurrent $I_L$ flowing through the first n-channel transistor 304 and the current flowing through the second n-channel transistor 305 are described as the same current. Note that the structure of this embodiment can be applied to the case where the photocurrent $I_L$ is amplified by changing the channel length or the channel width of the second n-channel transistor 305. In Formula 1, Is expresses reverse saturation current; q expresses elementary electric charge; k expresses Boltzmann constant [J·K$^{-1}$]; T expresses temperature [K]. Note that the reverse saturation current Is is a function having a member of temperature and is expressed as Formula 2.

[Formula 2]

$$I_S = A \exp\left(\frac{-E_g}{kT}\right) \quad (2)$$

In Formula 2, A expresses a constant, and $E_g$ expresses band gap energy [J].
In Formula 1, when $\Delta V_1$ in Formula 1 is solved assuming that $q\Delta V_1/kT$ is sufficiently larger than 1, Formula 3 is obtained.

[Formula 3]

$$\Delta V1 = \frac{kT}{q} \ln\left(\frac{IL}{I_S}\right) \quad (3)$$

As shown in Formula 3, the voltage $V_1$ which is generated in the one of the terminals of the first diode element 303 and corresponds to a difference between the high power supply potential Vdd and $\Delta V_1$ can be obtained with the current $I_L$ subjected to logarithmic compression.

Figure 4:
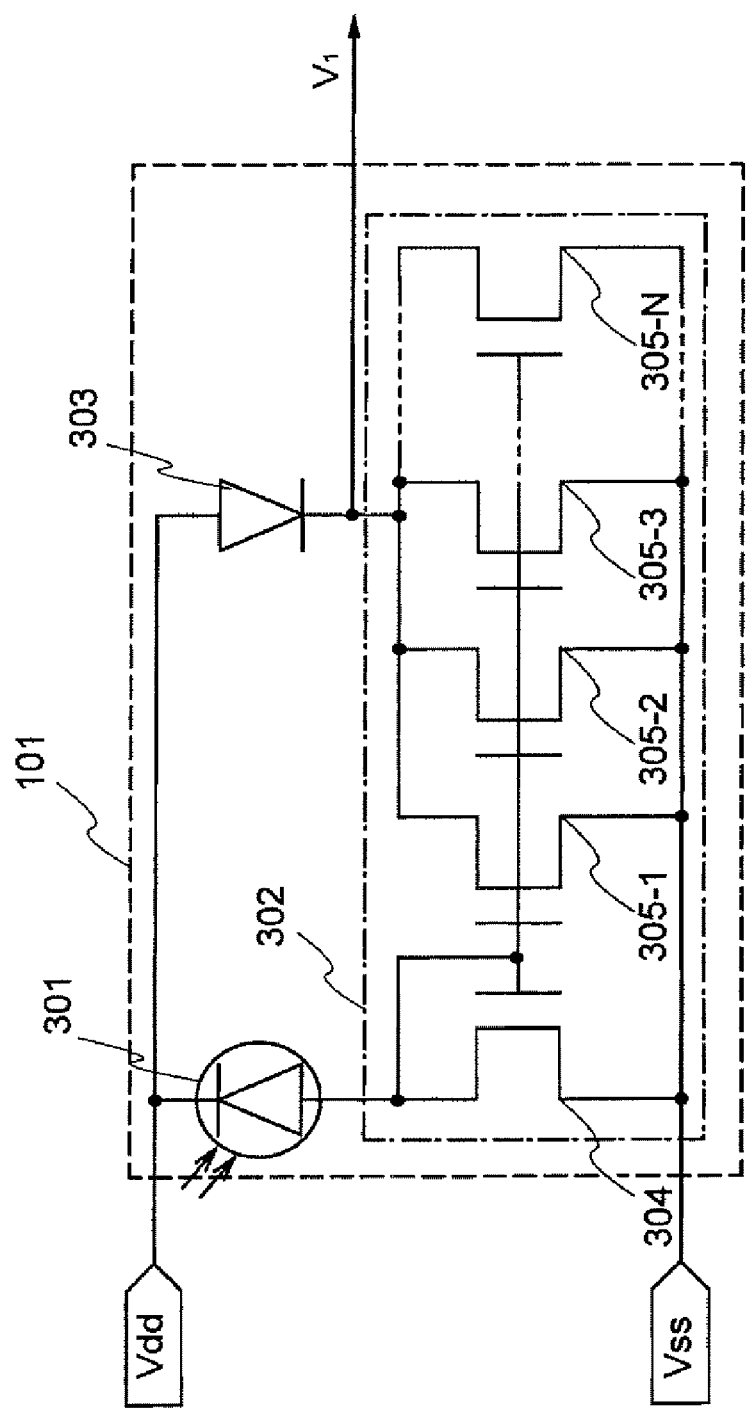
FIG. 4 is a circuit diagram for illustrating Embodiment 1.

Note that a plurality of the second n-channel transistors 305 in the current mirror circuit 302 of the photoelectric conversion circuit 101 may be disposed electrically in parallel to each other, as illustrated in FIG. 4. By providing a plurality of second n-channel transistors 305-1 to 305-N (N is a natural number more than or equal to 2) as illustrated in FIG. 4, when the photoelectric conversion element 301 is irradiated with light, the current flowing between the source and the drain of the first n-channel transistor is made N times and can be supplied to the second n-channel transistors 305-1 to 305-N sides. Therefore, even in the case where the amount of light used for irradiation of the photoelectric conversion element 301 is small, current enough to obtain the first voltage $V_1$ can be supplied by using the first diode element 303.

Figure 5:
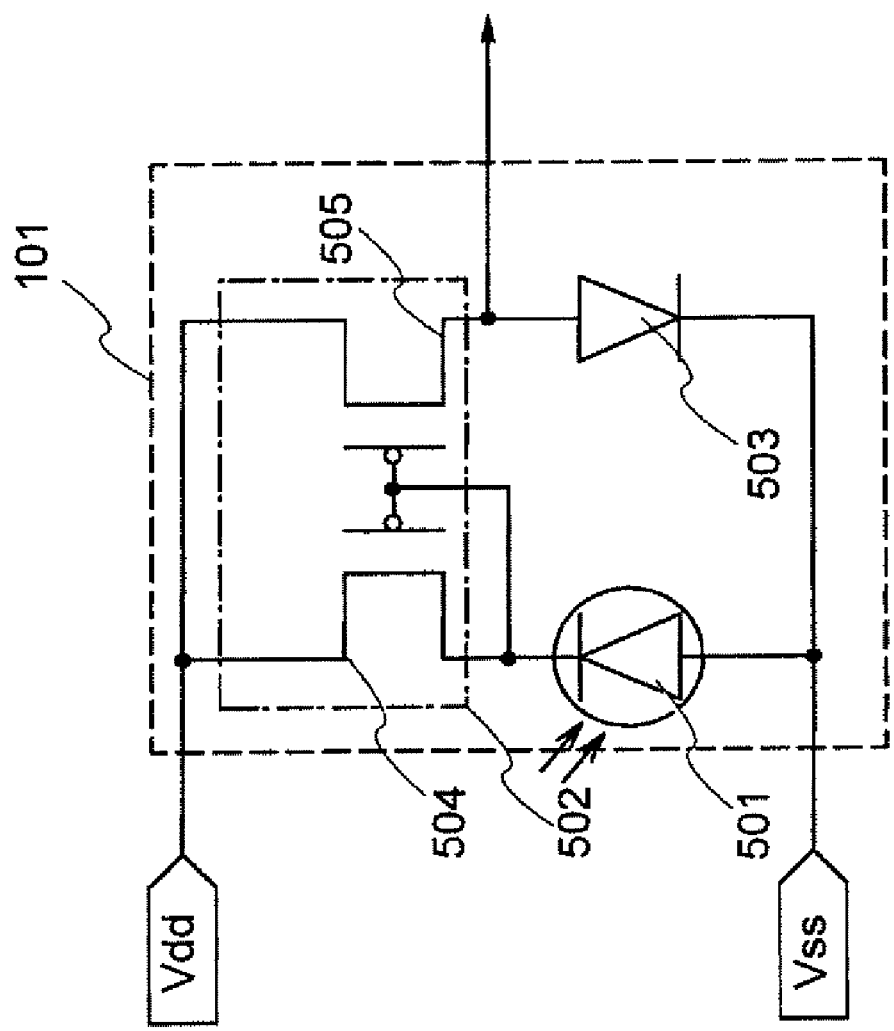
FIG. 5 is a circuit diagram for illustrating Embodiment 1.

Note that in this embodiment, the transistors in the current mirror circuit 302 of the photoelectric conversion circuit 101 are n-channel transistors as illustrated in FIG. 3; however, p-channel transistors may be used. In FIG. 5, a circuit diagram of the photoelectric conversion circuit in which a current mirror circuit is formed using p-channel transistors is described.

FIG. 5 illustrates an example of the specific circuit structure of the photoelectric conversion circuit 101 formed using p-channel transistors. The photoelectric conversion circuit 101 illustrated in FIG. 5 includes a photoelectric conversion element 501, a current mirror circuit 502, and a first diode element 503. The current mirror circuit 502 includes a first p-channel transistor 504 and a second p-channel transistor 505. One of terminals (cathode side) of the photoelectric conversion element 501 is electrically connected to the output side of the current mirror circuit 502. The low power supply potential Vss is applied to the other of the terminals (anode side) of the photoelectric conversion element 501. Gate terminals of the first p-channel transistor 504 and the second p-channel transistor 505 in the current mirror circuit 502 are electrically connected to each other. A first terminal of the first p-channel transistor 504 is electrically connected to the gate terminals of the first p-channel transistor 504 and the second p-channel transistor 505. The high power supply potential Vdd is applied to the first terminal of the first p-channel transistor 504 and a first terminal of the second p-channel transistor 505. A second terminal of the first p-channel transistor 504 is electrically connected to the one of the terminals (cathode side) of the photoelectric conversion element 501. The low power supply potential Vss is applied to the other of the terminals (anode side) of the photoelectric conversion element 501. The low power supply potential Vss is applied to one of terminals (cathode side) of the first diode element 503. The other of the terminals (anode side) of the first diode element 503 is electrically connected to a second terminal of the second p-channel transistor 505.

The operation of the photoelectric conversion circuit 101 illustrated in FIG. 5 is briefly described. When the photoelectric conversion element 501 is irradiated with light, the photocurrent $I_L$ flows. The photocurrent $I_L$ flows between the first terminal (drain) and the second terminal (source) of the first p-channel transistor 504. In a similar manner, the photocurrent $I_L$ also flows through the first terminal (drain) and the second terminal (source) of the second n-channel transistor 505. In this case, the first voltage $V_1$ can be obtained in accordance with the amount of the photocurrent $I_L$ flowing through the second p-channel transistor 505.

Note that a transistor such as an n-channel transistor or a p-channel transistor is an element which includes at least three terminals of a gate, a drain, and a source. The transistor has a channel region between a drain region and a source region and can supply current through the drain region, the channel region, and the source region. Here, since the source and the drain of the transistor change depending on the structure, the operating condition, and the like of the transistor, it is difficult to define which is a source or a drain. Therefore, in this embodiment, regions which serves as the source and the drain are referred to as a first terminal and a second terminal. Further, a terminal which serves as the gate is referred to as a gate.

Note that any of a variety of transistors can be used as a transistor such as an n-channel transistor or a p-channel transistor. For example, a thin film transistor (TFT) including a non-single crystal semiconductor film typified by amorphous silicon, polycrystalline silicon, microcrystalline (also referred to as microcrystal or semi-amorphous) silicon, or the like can be used. In the case of using the TFT, since the TFT can be formed at comparatively lower temperature, a manufacturing apparatus can be made larger and the TFT can be formed using a large substrate. Therefore, many photoelectric conversion devices can be manufactured in one manufacturing step at low cost. In addition, since the TFT can be formed at comparatively lower temperature, a substrate having low heat resistance can be used. Therefore, the transistor can be formed using a light-transmitting substrate. Accordingly, the transistor can be formed over a light-transmitting substrate (e.g., a glass substrate having an insulating surface) and can be used for a display utilizing transmission of light.

Next, an example of the specific circuit structure of the reference voltage generation circuit 102 illustrated in FIG. 1 is described. The reference voltage generation circuit 102 illustrated in FIG. 6 includes a resistor 601, a current mirror circuit 602, and a second diode element 603. The current mirror circuit 602 includes a first n-channel transistor 604 and a second n-channel transistor 605. The high power supply potential (Vdd) is applied to one of terminals of the resistor 601. The other of the terminals of the resistor 601 is electrically connected to the input side of the current mirror circuit 602. Gate terminals of the first n-channel transistor 604 and the second n-channel transistor 605 in the current mirror circuit 602 are electrically connected to each other. A first terminal of the first n-channel transistor 604 is electrically connected to the gate terminals of the first n-channel transistor 604 and the second n-channel transistor 605. The low power supply potential (Vss) is applied to second terminals of the first n-channel transistor 604 and the second n-channel transistor 605. One of terminals (cathode side) of the second diode element 603 is electrically connected to a first terminal of the second n-channel transistor 605. The high power supply potential Vdd is applied to the other of the terminals (anode side) of the second diode element 603.

Figure 6:
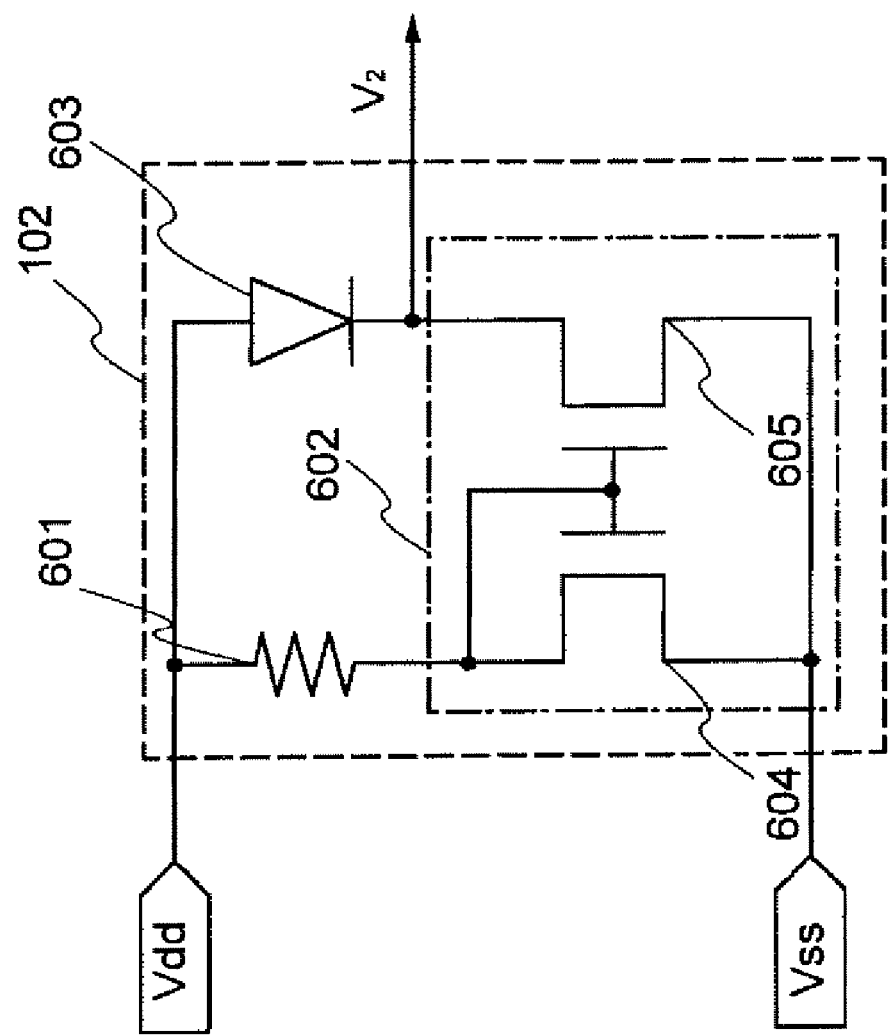
FIG. 6 is a circuit diagram for illustrating Embodiment 1.

The operation of the reference voltage generation circuit 102 illustrated in FIG. 6 is briefly described. Current $I_{ref}$ flows in accordance with the resistance value of the resistor 601. The current $I_{ref}$ flows between the first terminal (drain) and the second terminal (source) of the first n-channel transistor 604. In a similar manner, current corresponding to the current $I_{ref}$ flows between the first terminal (drain) and the second terminal (source) of the second n-channel transistor 605. In this case, the current flowing through the second n-channel transistor 605 flows to the second diode element 603. The voltage-current characteristics of the second diode element 603 is expressed as Formula 4.

[Formula 4]

$$Iref = IS \exp\left(\frac{q\Delta V2}{kT} - 1\right) \quad (4)$$

Note that in this embodiment, for illustrative purposes, the current $I_{ref}$ flowing through the first n-channel transistor 604 and the current flowing through the second n-channel transistor 605 are described as the same current. Note that the structure of this embodiment can be applied to the case where the current $I_{ref}$ is amplified by changing the channel length or the channel width of the second n-channel transistor 605.

In Formula 4, when $\Delta V_2$ in Formula 4 is solved assuming that $q\Delta V_1/kT$ is sufficiently larger than 1, Formula 5 is obtained.

[Formula 5]

$$\Delta V2 = \frac{kT}{q}\ln\left(\frac{Iref}{Is}\right) \quad (5)$$

As shown in Formula 5, the voltage $V_2$ which is generated in the one of the terminals of the second diode element 603 and corresponds to a difference between the high power supply potential Vdd and $\Delta V_2$ can be obtained with the current $I_{ref}$ subjected to logarithmic compression.

Note that in the reference voltage generation circuit 102, a plurality of the second n-channel transistors in the current mirror circuit 602 may be disposed electrically in parallel to each other, as illustrated in FIG. 4. Alternatively, the reference voltage generation circuit may be formed using p-channel transistors as transistors included in the current mirror circuit, as illustrated in FIG. 5. In the case where the reference voltage generation circuit 102 is formed using p-channel transistors, by using the photoelectric conversion element in the circuit structure in FIG. 5 as a resistor, the reference voltage generation circuit 102 can be formed using p-channel transistors.

Note that the resistance value of the resistor 601 in the reference voltage generation circuit 102 is preferably set to a certain value so that the amount of the current $I_{ref}$ flowing to the current mirror circuit 602 is the lower limit of the photocurrent $I_L$ which is obtained when the photoelectric conversion element 301 is irradiated with light. That is, a resistance value for supplying the current $I_{ref}$ when the photoelectric conversion element 301 in the photoelectric conversion circuit 101 is irradiated with light having illuminance higher than or equal to detectable illuminance is the resistance value of the resistor. Note that in this specification, the illuminance of light when the current $I_L$ having the lower limit flows by irradiating the photoelectric conversion element 301 with the light is referred to as reference illuminance.

Next, the specific circuit structures of the arithmetic circuit 103 and the output circuit 104 illustrated in FIG. 1 are described with reference to FIG. 7. The arithmetic circuit 103 includes a resistor 701 and an operational amplifier 702. The output circuit 104 includes an n-channel transistor 703, a p-channel transistor 704, and a current mirror circuit 705. The current mirror circuit 705 includes a first p-channel transistor 706 and a second p-channel transistor 707. Note that in the circuit structure illustrated in FIG. 7, the internal resistor 201 is provided as illustrated in FIG. 2, and the voltage $V_{out}$ is obtained as output to the outside in accordance with the current $I_{out}$ output from the output circuit 104.

Figure 7:
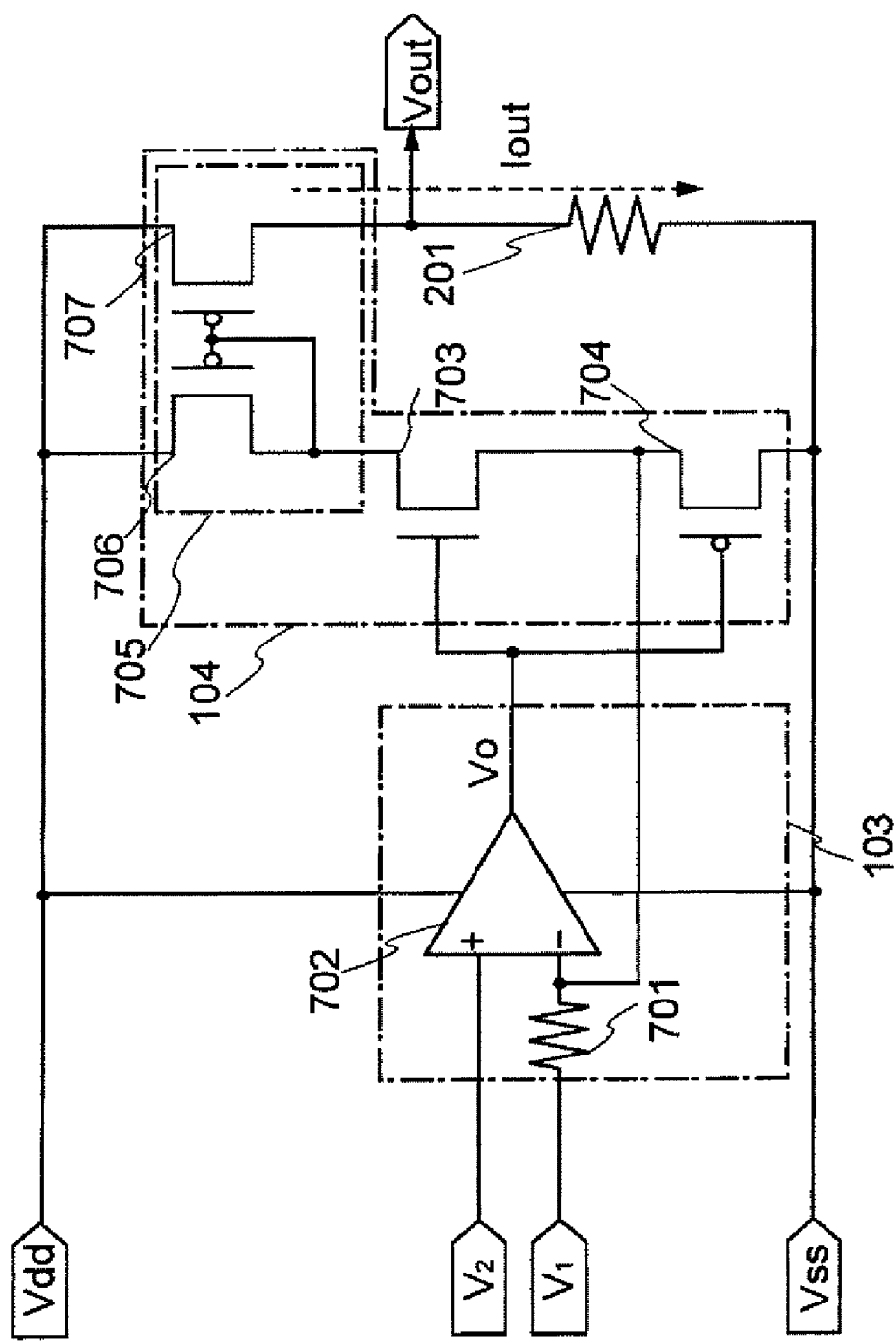
FIG. 7 is a circuit diagram for illustrating Embodiment 1.

In FIG. 7, one of terminals of the resistor 701 is electrically connected to a wiring for applying the first voltage $V_1$, and the other of the terminals of the resistor 701 is electrically connected to an inverting input terminal of the operational amplifier 702. A non-inverting input terminal of the operational amplifier 702 is electrically connected to a wiring for applying the second voltage $V_2$. An output terminal of the operational amplifier 702 is electrically connected to gates of the n-channel transistor 703 and the p-channel transistor 704. The operational amplifier 702 is electrically connected to a wiring to which the high power supply potential Vdd is applied and a wiring to which the low power supply potential Vss is applied. First terminals of the first p-channel transistor 706 and the second p-channel transistor 707 in the current mirror circuit 705 are electrically connected to the wiring to which the high power supply potential Vdd is applied. A gate and a second terminal of the first p-channel transistor 706 are electrically connected to a first terminal of the n-channel transistor 703. A second terminal of the second p-channel transistor 707 is electrically connected to a terminal for outputting the voltage $V_{out}$ in accordance with the amount of the current $I_{out}$ flowing to the internal resistor 201. A second terminal of the n-channel transistor 703 is electrically connected to a first terminal of the p-channel transistor 704. A second terminal of the p-channel transistor 704 is electrically connected to the wiring to which the low power supply potential Vss is applied.

Note that the resistor 701 is an element for converting the voltage of the inverting input terminal of the operational amplifier 702 into current and having a resistance value so that current flows between opposite terminals.

Note that in the structure of FIG. 7 illustrated in this embodiment, the n-channel transistor 703 and the p-channel transistor 704 are used; however, the structure of FIG. 7 is not limited to this. For example, instead of the n-channel transistor 703 and the p-channel transistor 704, switches which switch on/off in accordance with the signal $V_0$ from the output terminal of the operational amplifier 702 may be used.

Note that any switch may be used as long as it can control conduction and non-conduction between one of terminals and the other of the terminals, without limitation on a certain type. As the switch, an electrical switch, a mechanical switch, or the like can be used. For example, a thin film transistor may be used.

Next, an example of the specific circuit structure of the operational amplifier 702 illustrated in FIG. 7 is described. The operational amplifier 702 illustrated in FIG. 8 includes a resistor 801, a current source circuit 802, a current mirror circuit 803, a differential amplifier circuit 804, a capacitor 805, and a p-channel transistor 806. The current source circuit 802 includes a first n-channel transistor 807, a second n-channel transistor 808, and a third n-channel transistor 809. In addition, the current mirror circuit 803 includes a first p-channel transistor 810 and a second p-channel transistor 811. The differential amplifier circuit 804 includes a first n-channel transistor 812 and a second n-channel transistor 813.

Figure 8:
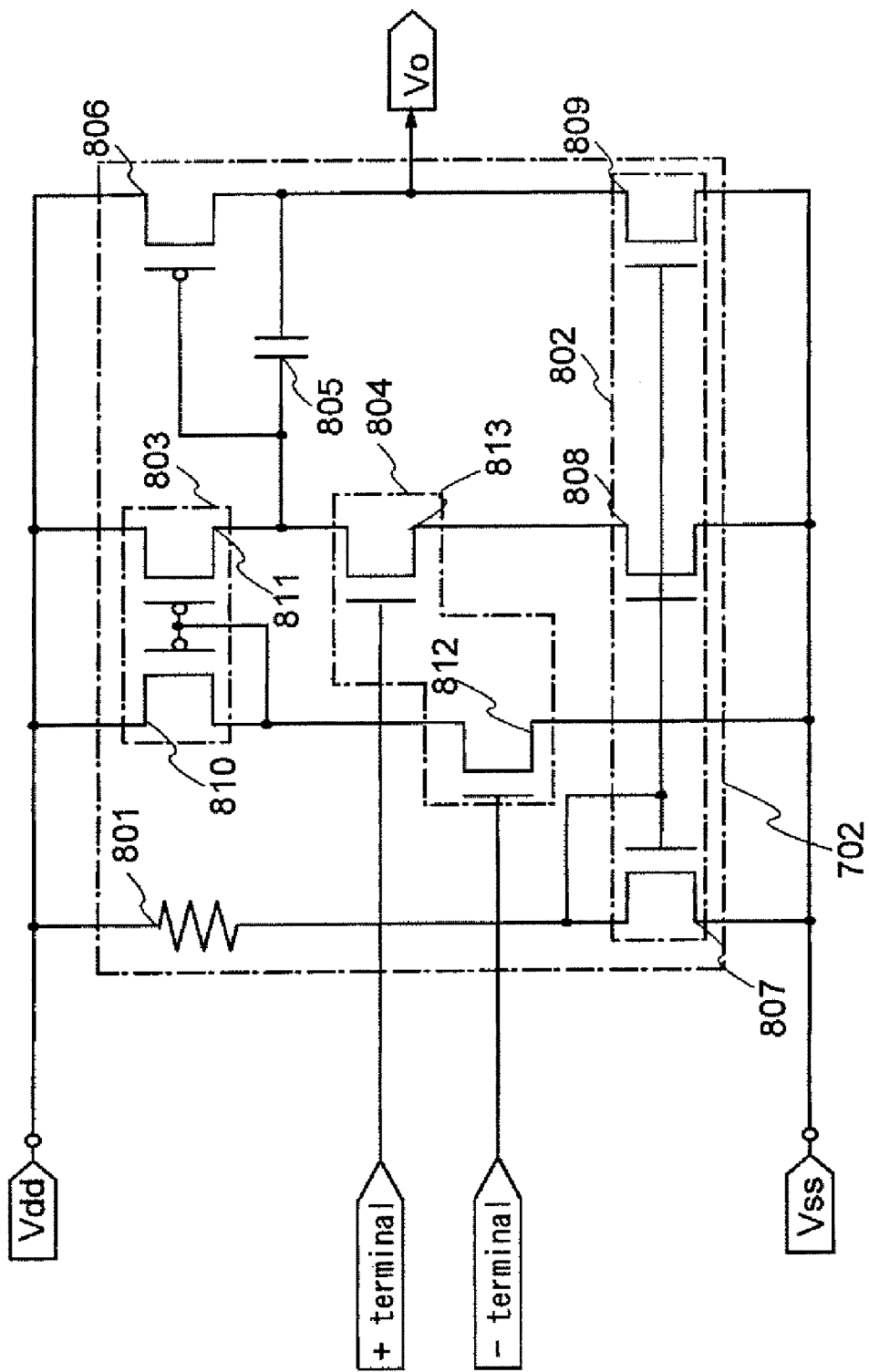
FIG. 8 is a circuit diagram for illustrating Embodiment 1.

The operation of the operational amplifier 702 illustrated in FIG. 8 is briefly described. The operational amplifier 702 illustrated in FIG. 8 is a circuit for amplifying a difference between the first voltage $V_1$ and the second voltage $V_2$ and outputting the output signal $V_0$ through the p-channel transistor 806 in the case where the level of the first voltage $V_1$ which is input to the differential amplifier circuit 804 is lower than the level of the second voltage $V_2$, i.e., in the case where the illuminance of light with respect to the photoelectric conversion element 301 is higher than the reference illuminance.

Note that the capacitor 805 is provided in order that the output signal $V_0$ can be stably output through the p-channel transistor 806 in accordance with the first voltage $V_1$ and the second voltage $V_2$ and is provided as necessary. The operations of the arithmetic circuit 103 and the output circuit 104 illustrated in FIG. 7 are briefly described. When the first voltage $V_1$ and the second voltage $V_2$ are input to the operational amplifier 702, the operational amplifier 702 operates. In the operational amplifier 702, the potential of the output signal $V_0$ which is output rises in the case where the level of the first voltage $V_1$ is lower than the level of the second voltage $V_2$, i.e., in the case where the photoelectric conversion element 301 is irradiated with light having illuminance higher than or equal to the reference illuminance. Then, by the output signal $V_1$, the n-channel transistor 703 is turned on (brought into conduction) and the p-channel transistor 704 is turned off (brought out of conduction). Accordingly, in accordance with the potential of the first voltage $V_1$, the current $I_{out}$ flowing through the first p-channel transistor 706 and the second p-channel transistor 707 in the current mirror circuit 705 is output.

On the other hand, in the case where the level of the first voltage $V_1$ is higher than the level of the second voltage $V_2$ in the operational amplifier 702, i.e., in the case where the photoelectric conversion element 301 is irradiated with light having illuminance lower than or equal to the reference illuminance, the potential of the output signal $V_0$ output from the operational amplifier 702 becomes lower. Therefore, by the output signal $V_0$, the n-channel transistor 703 is turned off and the p-channel transistor 704 is turned on. Accordingly, since the first voltage $V_1$ which is input to the inverting input signal of the operational amplifier 702 is applied to the low power supply potential Vss, the current $I_{out}$ is not output to the first p-channel transistor 706 and the second p-channel transistor 707 in the current mirror circuit 705.

Note that in the operational amplifier 702 of this embodiment, when the first voltage $V_1$ and the second voltage $V_2$ are input and a difference between two signals is amplified, the output signal $V_0$ is obtained. The first voltage $V_1$ and the second voltage $V_2$ have variables related to temperature as shown in Formula 3 and Formula 5 and fluctuate depending on temperature. By obtaining the difference between the first voltage $V_1$ and the second voltage $V_2$ in the operational amplifier 702, the members in Formula 3 and Formula 5 are compensated, so that the output signal $V_0$ can be obtained. Therefore, the current $I_{out}$ in this embodiment can be output with the adverse effect of the temperature dependence of the diode element relieved.

Next, an example of the circuit structures of the arithmetic circuit 103 and the output circuit 104 illustrated in FIG. 1, which is different from the example of the circuit structures illustrated in FIG. 7, is described. The circuit structures of the arithmetic circuit 103 and the output circuit 104 illustrated in FIG. 9 differ from the circuit structures in FIG. 7 in that a second output signal $V_{ref}$ is output in addition to the first output signal $V_0$ which is output from the operational amplifier 702, the first output signal $V_0$ is supplied to the gate of the n-channel transistor 703, and the second output signal $V_{ref}$ is supplied to the gate of the n-channel transistor 704.

Figure 9:
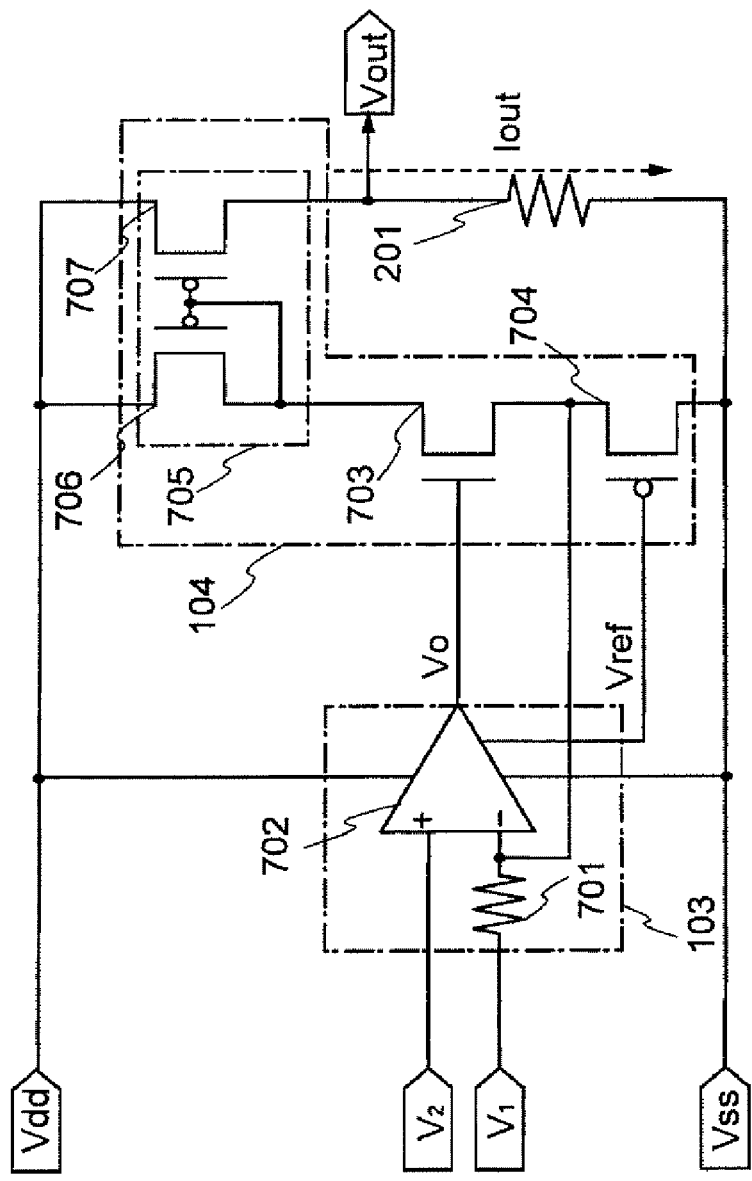
FIG. 9 is a circuit diagram for illustrating Embodiment 1.

An example of the specific circuit structure of the operational amplifier 702 illustrated in FIG. 9 is described. The operational amplifier 702 illustrated in FIG. 10 includes the resistor 801, the current source circuit 802, the current mirror circuit 803, the differential amplifier circuit 804, the capacitor 805, the p-channel transistor 806, and an n-channel transistor 1001. The operational amplifier 702 illustrated in FIG. 10 differs from the operational amplifier 702 illustrated in FIG. 8 in that the diode-connected n-channel transistor 1001 is provided on the drain side of the p-channel transistor 806 and the second output signal $V_{ref}$ is output from the source side of the n-channel transistor 1001.

Figure 10:
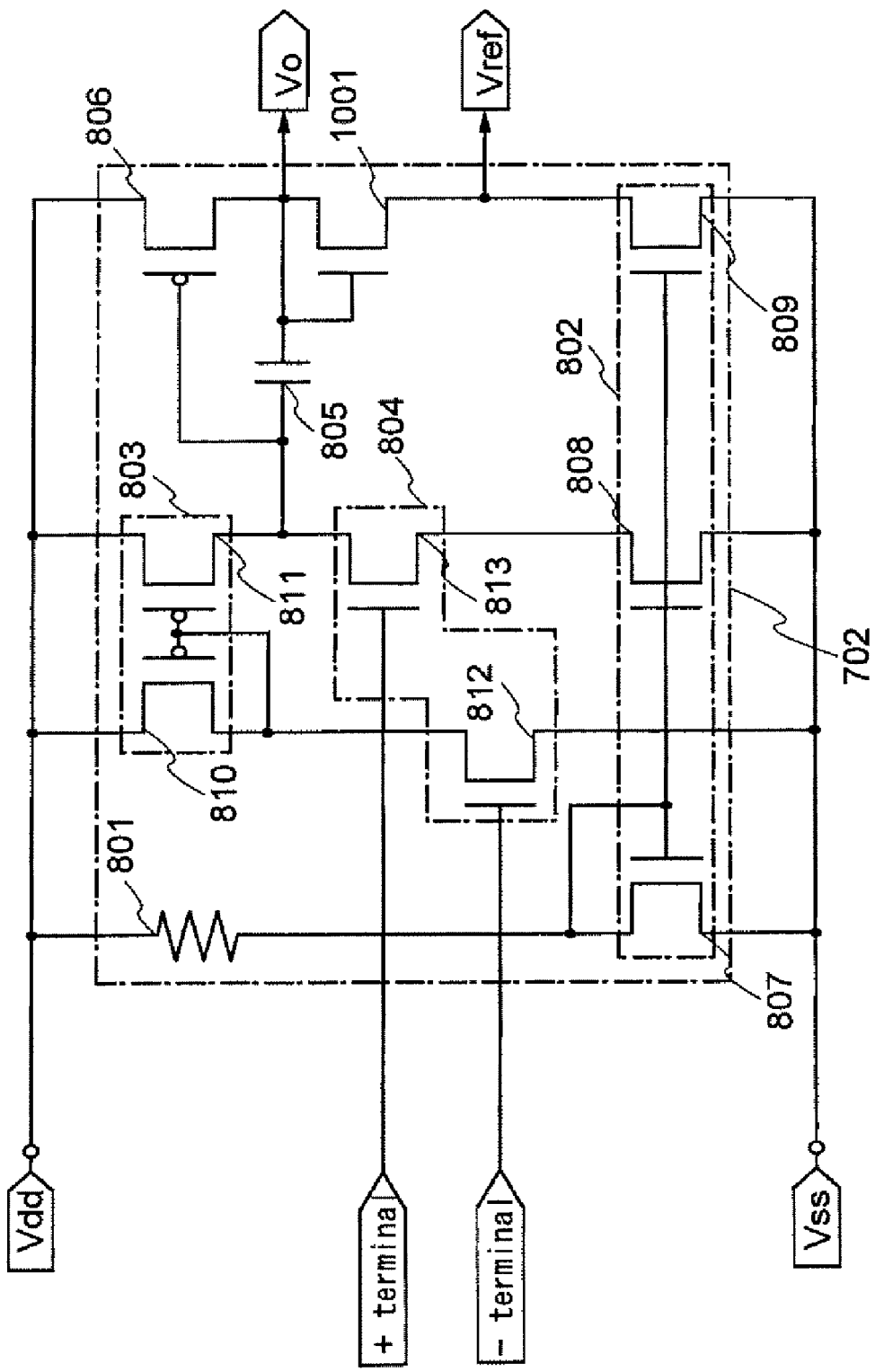
FIG. 10 is a circuit diagram for illustrating Embodiment 1.

The operation of the operational amplifier 702 illustrated in FIG. 10 is briefly described. The operational amplifier 702 illustrated in FIG. 10 is a circuit for outputting the output signal $V_0$ and the second output signal $V_{ref}$ which is a signal having a potential obtained by subtracting the threshold voltage of the n-channel transistor 1001 from the output signal $V_0$ through the p-channel transistor 806 in accordance with the difference between the first voltage $V_1$ and the second voltage $V_2$ in the case where the level of the first voltage $V_1$ which is input to the differential amplifier circuit 804 is lower than the level of the second voltage $V_2$, i.e., in the case where the illuminance of light with respect to the photoelectric conversion element 301 is higher than the reference illuminance. By using the structure where the first output signal $V_0$ is supplied to the gate of the n-channel transistor 703 and the second output signal $V_{ref}$ is supplied to the gate of the p-channel transistor 704, on/off of the n-channel transistor 703 and the p-channel transistor 704 can be controlled more surely.

As described above, in the structure of the photoelectric conversion device of this embodiment, a photoelectric conversion device can be obtained in which output can be obtained by reducing the adverse effect of fluctuation in the output due to the temperature dependence of a diode element for logarithmic compression. Further, in the structure of the photoelectric conversion device of this embodiment, by fixing output with the illuminance of light which used for irradiation of a photoelectric conversion element made lower than or equal to reference illuminance, constant output can be obtained even in the case where weak light which is less than the lower limit of detection of the photoelectric conversion element is detected.

Note that the contents described in each drawing in this embodiment can be freely combined with or replaced with the contents described in any of other embodiments as appropriate.

Embodiment 2

In this embodiment, a specific structure in the case where the first voltage $V_1$ and the second voltage $V_2$ are used as signals amplified in a source follower circuit instead of using the first voltage $V_1$ and the second voltage $V_2$ which are input to the arithmetic circuit 103 in the photoelectric conversion device 100 described in the above embodiment is described. Note that in this embodiment, portions described in Embodiment 1 are denoted by the same reference numerals as in Embodiment 1, and description thereof is omitted.

Figure 11:
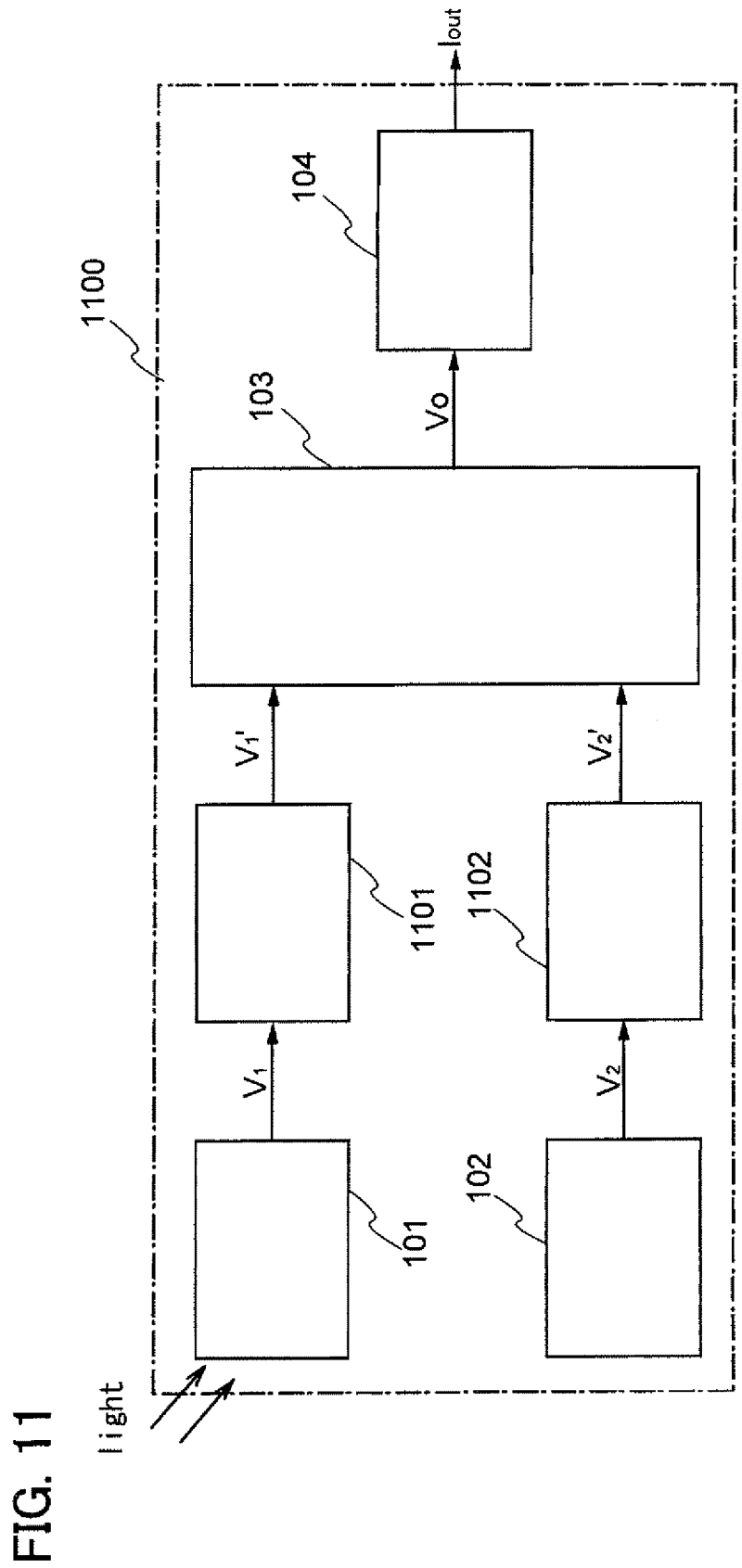
FIG. 11 is a block diagram for illustrating Embodiment 2.

A photoelectric conversion device 1100 illustrated in FIG. 11 includes the photoelectric conversion circuit 101, the reference voltage generation circuit 102, the arithmetic circuit 103, the output circuit 104, a first amplifier circuit 1101, and a second amplifier circuit 1102. The photoelectric conversion device 1100 illustrated in FIG. 11 differs from the photoelectric conversion device 100 described in Embodiment 1 in that the first amplifier circuit 1101 and the second amplifier circuit 1102 are provided. The first voltage $V_1$ which is output from the photoelectric conversion circuit 101 is input to the first amplifier circuit 1101. The first amplifier circuit 1101 inputs voltage $V_1$ obtained by amplifying the first voltage $V_1$ to the arithmetic circuit 103. In addition, the second voltage $V_2$ which is output from the photoelectric conversion circuit 101 is input to the second amplifier circuit 1102. The second amplifier circuit 1102 inputs voltage $V_2$ obtained by amplifying the second voltage $V_2$ to the arithmetic circuit 103.

Figure 12:
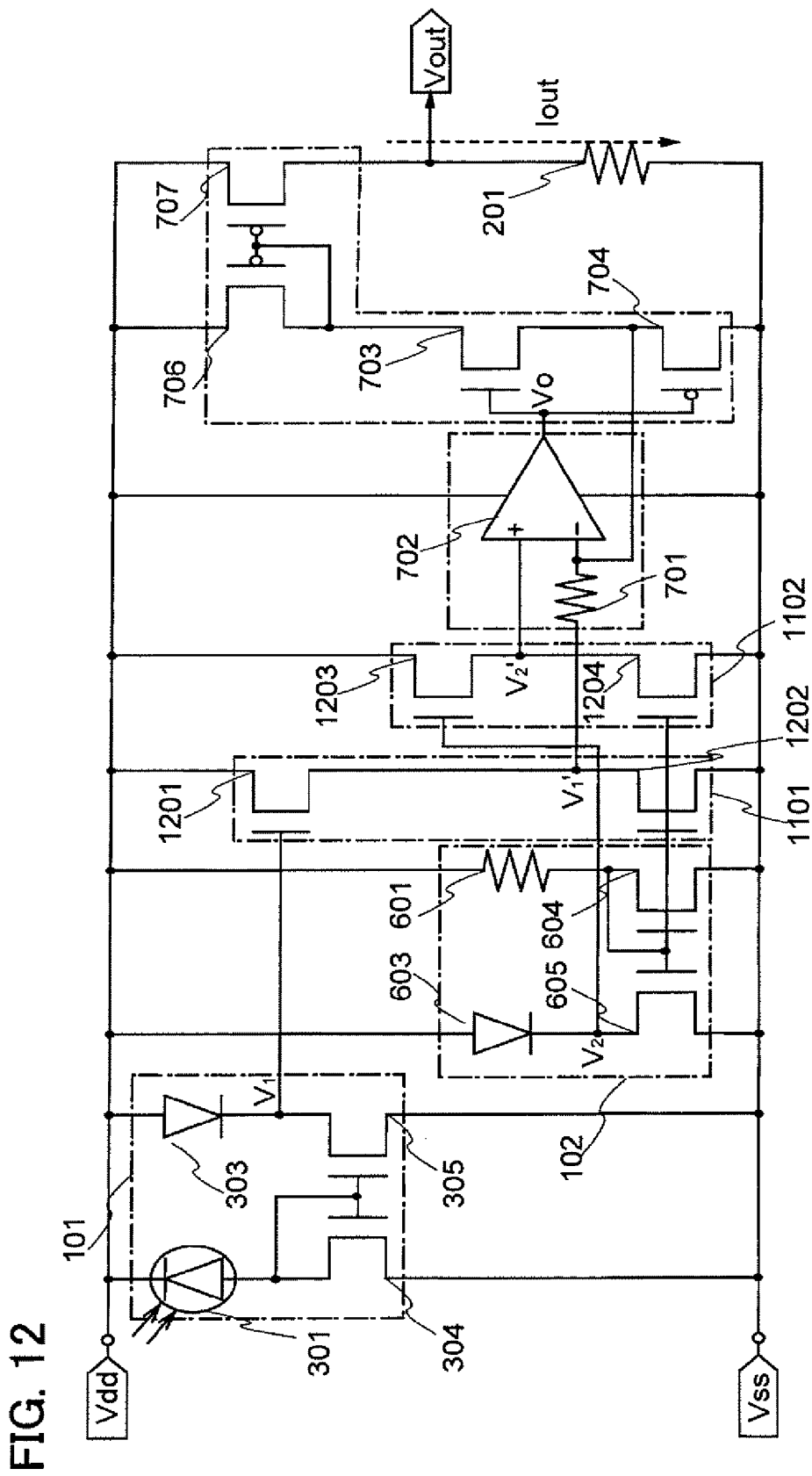
FIG. 12 is a circuit diagram for illustrating Embodiment 2.

Next, the circuit structure of the photoelectric conversion device 1100 illustrated in FIG. 11 is described in FIG. 12 together with the circuit structure of each block described in Embodiment 1. In a circuit illustrated in FIG. 12, the structure of the photoelectric conversion circuit 101 is similar to that described in FIG. 3 in Embodiment 1. In addition, the structure of the reference voltage generation circuit 102 is similar to that described in FIG. 6 in Embodiment 1. Further, the structures of the arithmetic circuit 103 and the output circuit 104 are similar to those described in FIG. 7 in Embodiment 1. The first amplifier circuit 1101 includes a first n-channel transistor 1201 and a second n-channel transistor 1202. Further, the second amplifier circuit 1102 includes a first n-channel transistor 1203 and a second n-channel transistor 1204. Gates of the second n-channel transistor 1202 and the second n-channel transistor 1204 are electrically connected to the gates of the first n-channel transistor 604 and the second n-channel transistor 605 which are included in the current mirror circuit in the reference voltage generation circuit 102. Therefore, the second n-channel transistor 1202 and the second n-channel transistor 1204 serve as current sources. On the other hand, terminals which serve as drains of the first n-channel transistor 1201 and the first n-channel transistor 1203 are both electrically connected to a wiring to which a high power supply potential is applied. The first voltage $V_1$ which is output from the photoelectric conversion circuit 101 and the second voltage $V_2$ which is output from the reference voltage generation circuit 102 are applied to gates of the first n-channel transistor 1201 and the first n-channel transistor 1203. Therefore, the first amplifier circuit 1101 and the second amplifier circuit 1102 amplify voltage which is input and can output the amplified voltage, as source follower circuits.

Note that although source follower circuits are used as the first amplifier circuit 1101 and the second amplifier circuit 1102 for amplifying the first voltage $V_1$ and the second voltage $V_2$ in this embodiment, this embodiment is not limited to this. It is acceptable to use any circuits as long as they amplify voltage which is input and output the amplified voltage.

When a signal amplified in accordance with the level of the first voltage $V_1$ and a signal amplified in accordance with the level of the second voltage $V_2$ which are described in this embodiment are input to the inverting input terminal and the non-inverting input terminal of the operational amplifier 702, the operational amplifier 702 can be operated stably.

Figure 13A:
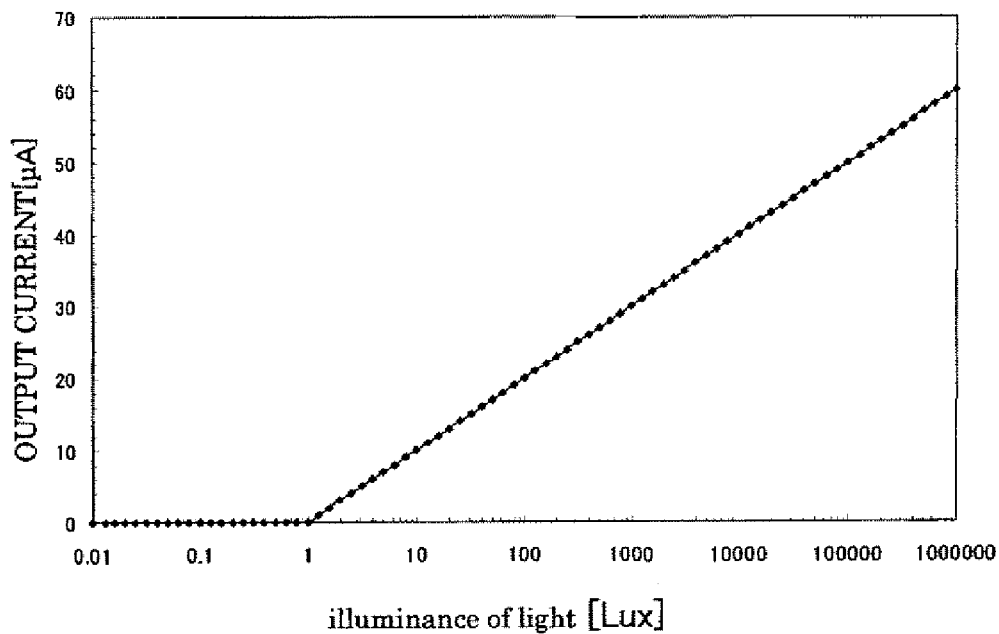
Figure 13B:
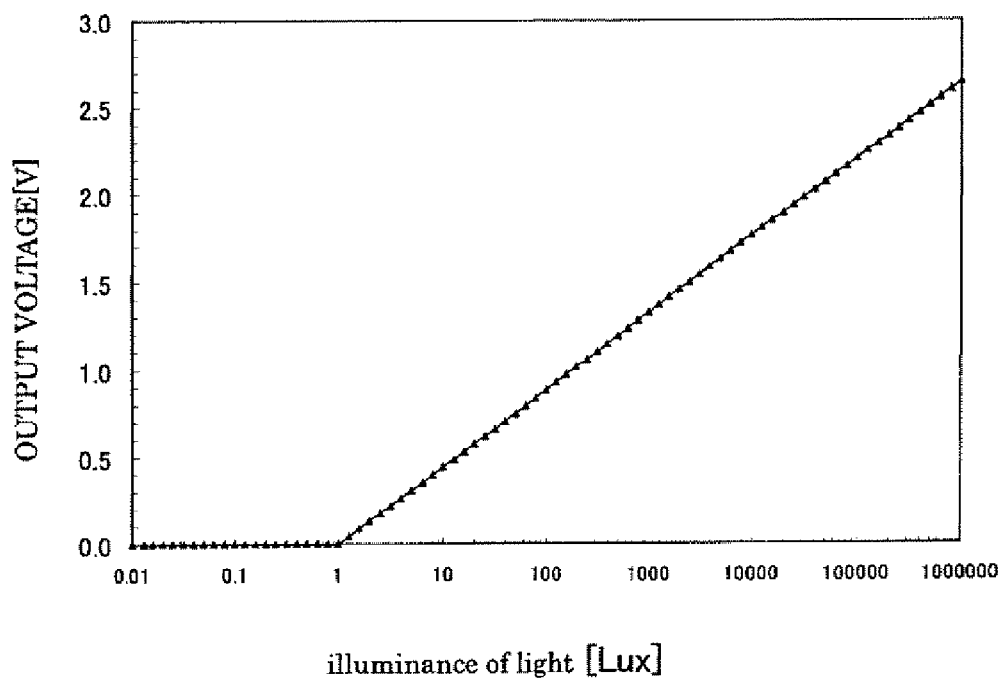

FIGS. 13A and 13B illustrate the simulation results of current or voltage which is output from a photoelectric conversion device with respect to the illuminance of light which enters a photoelectric conversion element, by using the circuit illustrated in FIG. 12. Note that the voltage which is output from the photoelectric conversion device is output to the outside by providing an internal resistor in the photoelectric conversion device as illustrated in FIG. 2 in Embodiment 1. FIG. 13A illustrates the current which is output from the photoelectric conversion device with respect to the illuminance of light which enters the photoelectric conversion element. FIG. 13B illustrates the voltage which is output from the photoelectric conversion device with respect to the illuminance of light which enters the photoelectric conversion element. As is clear from FIGS. 13A and 13B, according to the photoelectric conversion device of this embodiment, logarithmic compression can be performed on output (current or voltage) with respect to the illuminance of incident light and constant output (current or voltage) can be obtained at illuminance lower than constant illuminance.

As described above, in the structure of the photoelectric conversion device of this embodiment, a photoelectric conversion device can be obtained in which output can be obtained by reducing the adverse effect of fluctuation in the output due to the temperature dependence of a diode element for logarithmic compression. Further, in the structure of the photoelectric conversion device of this embodiment, by fixing output with the illuminance of light which is used for irradiation of a photoelectric conversion element made lower than or equal to reference illuminance, constant output can be obtained even in the case where weak light which is less than the lower limit of detection of the photoelectric conversion element is detected. Further, in particular, since voltage which is input to an operational amplifier can be amplified and output in the first amplifier circuit and the second amplifier circuit described in this embodiment, the operational amplifier can be operated stably.

Note that the contents described in each drawing in this embodiment can be freely combined with or replaced with the contents described in any of other embodiments as appropriate.

Embodiment 3

Figure 14:
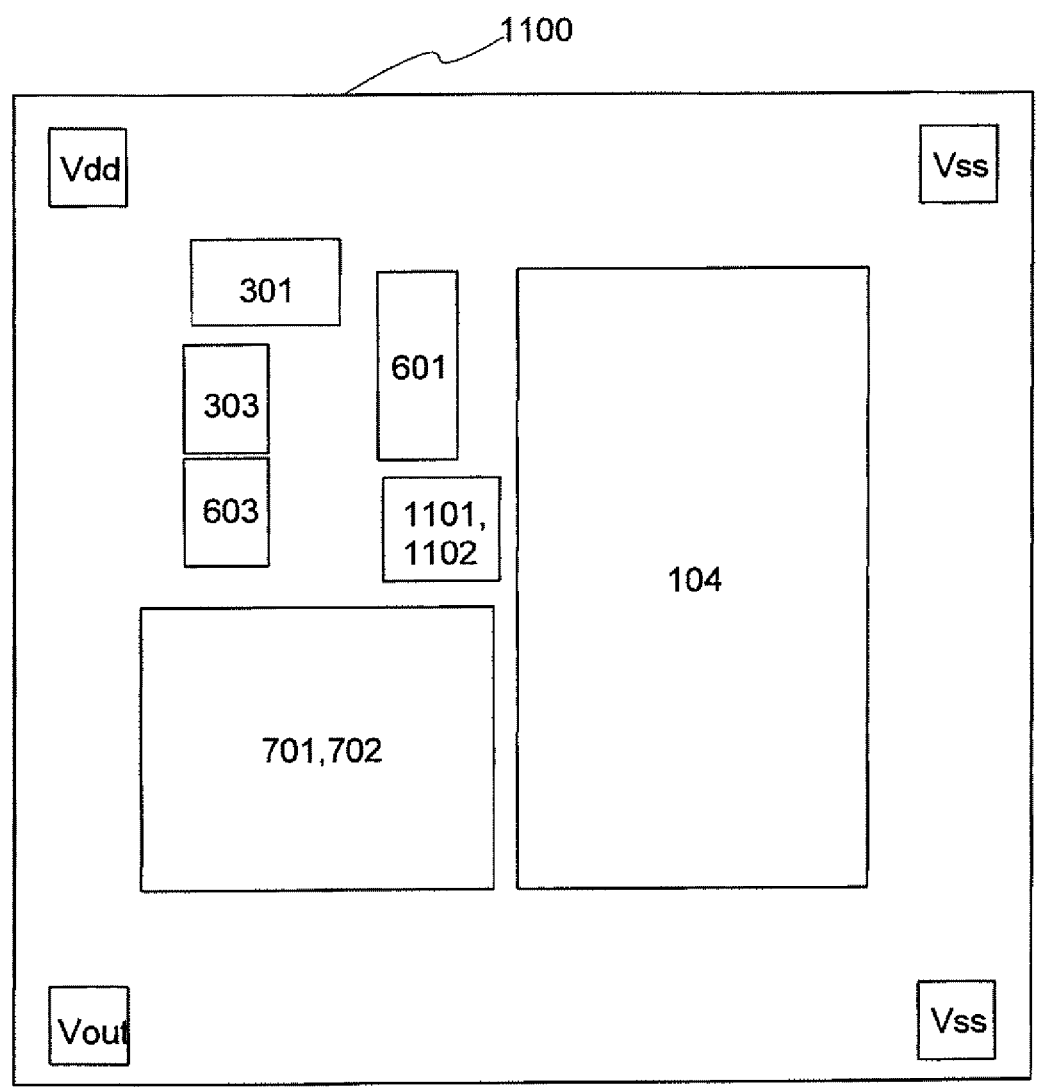
FIG. 14 is a block diagram for illustrating Embodiment 3.

In this embodiment, a layout example of each circuit is described with reference to a block diagram of a photoelectric conversion device. FIG. 14 is a block diagram of the photoelectric conversion device, which illustrates the layout of each circuit in the circuit illustrated in FIG. 12 in Embodiment 2. In the photoelectric conversion device 1100 illustrated in FIG. 14, the photoelectric conversion element 301, the resistor 601, the first diode element 303, the second diode element 603, the first amplifier circuit 1101, the second amplifier circuit 1102, the resistor 701, the operational amplifier 702, and the output circuit 104 are illustrated. Note that in FIG. 14, a terminal to which the high power supply potential Vdd is applied, a terminal to which the low power supply potential Vss is applied, and a terminal for outputting the voltage $V_{out}$ obtained in the photoelectric conversion device to the outside are also illustrated.

As described in the above embodiment, in the structure of the photoelectric conversion device of this embodiment, a photoelectric conversion device can be obtained in which output can be obtained by reducing the adverse effect of fluctuation in the output due to the temperature dependence of a diode element for logarithmic compression. Further, in the structure of the photoelectric conversion device of this embodiment, by fixing output with the illuminance of light which is used for irradiation of a photoelectric conversion element made lower than or equal to reference illuminance, constant output can be obtained even in the case where weak light which is less than the lower limit of detection of the photoelectric conversion element is detected. Further, in particular, since voltage which is input to an operational amplifier can be amplified and output in the first amplifier circuit and the second amplifier circuit described in this embodiment, the operational amplifier can be operated stably.

In addition, in this embodiment, by providing the first diode element 303 and the second diode element 603 adjacent to each other as illustrated in the layout of each circuit included in the photoelectric conversion device, a photoelectric conversion device can be obtained in which the adverse effect of fluctuation in output due to the temperature dependence of a diode element for logarithmic compression can be further reduced.

Note that the contents described in each drawing in this embodiment can be freely combined with or replaced with the contents described in any of other embodiments as appropriate.

Embodiment 4

In this embodiment, as for the block diagram of the photoelectric conversion device illustrated in Embodiment 2, examples of the circuit structure and the layout of each circuit, which are different from those in FIG. 12, are described, and a method for manufacturing the photoelectric conversion device is specifically described. Note that in this embodiment, portions described in Embodiments 1 to 3 are denoted by the same reference numerals as in Embodiments 1 to 3, and description thereof is omitted.

Figure 15:
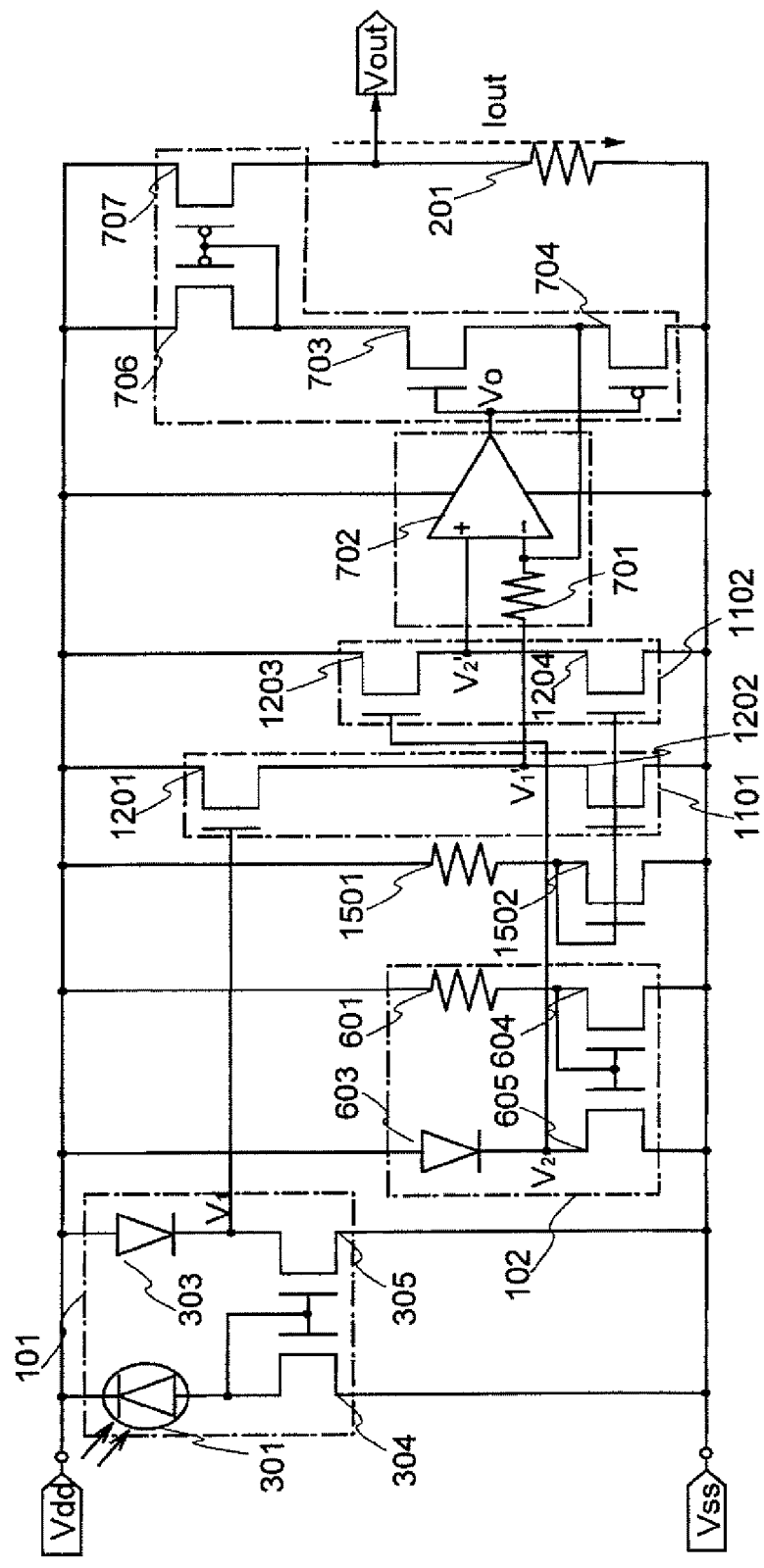
FIG. 15 is a circuit diagram for illustrating Embodiment 4.

First, the circuit structure of the photoelectric conversion device is described in FIG. 15 together with the circuit structure of each block described in Embodiment 1. In a circuit illustrated in FIG. 15, the structure of the photoelectric conversion circuit 101 is similar to that described in FIG. 3 in Embodiment 1. In addition, the structure of the reference voltage generation circuit 102 is similar to that described in FIG. 6 in Embodiment 1. Further, the structures of the arithmetic circuit 103 and the output circuit 104 are similar to those described in FIG. 7 in Embodiment 1. The structure of the first amplifier circuit 1101 is similar to that described in FIG. 12 in Embodiment 2. Further, the structure of the second amplifier circuit 1102 is similar to that described in FIG. 12 in Embodiment 2. The circuit illustrated in FIG. 15 differs from the circuit illustrated in FIG. 12 in Embodiment 2 in that a resistor 1501 and a diode-connected n-channel transistor 1502 are provided.

In the circuit structure illustrated in FIG. 15, the gates of the second n-channel transistor 1202 and the second n-channel transistor 1204 are electrically connected to a gate of the diode-connected n-channel transistor 1502. Therefore, the second n-channel transistor 1202 and the second n-channel transistor 1204 serve as current sources. Unlike FIG. 12, by generating voltage which is applied to the gates of the transistors which serves as the current sources of the first amplifier circuit 1101 and the second amplifier circuit 1102 by using the resistor 1501 and the diode-connected n-channel transistor 1502 which are additionally provided, the amplification factors of voltage in the first amplifier circuit 1101 and the second amplifier circuit 1102 can be increased. Therefore, the operational amplifier 702 can be operated more stably. Note that the resistance value of the resistor 1501 may be selected in accordance with the amount of current which should flow between a source and a drain of the diode-connected n-channel transistor 1502.

Figure 16:
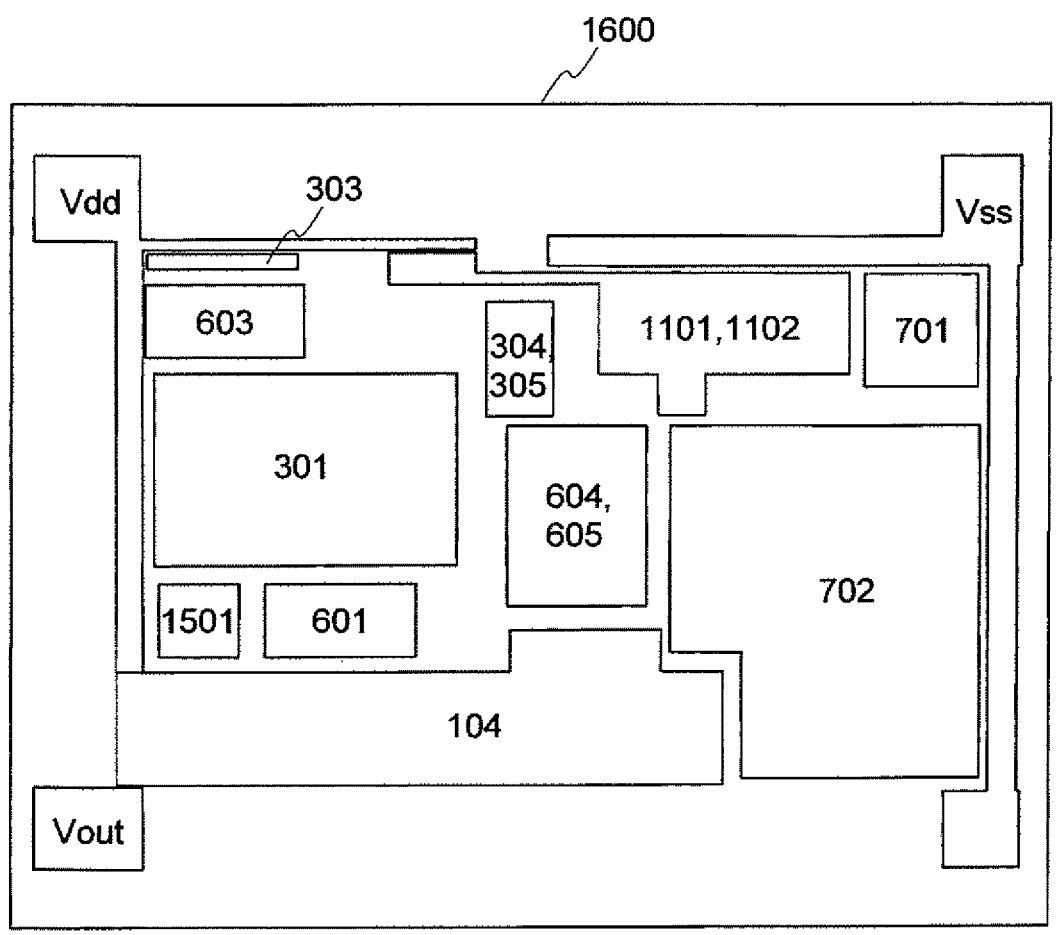
FIG. 16 is a block diagram for illustrating Embodiment 4.

Next, the layout of each circuit in the circuit illustrated in FIG. 15 is illustrated in FIG. 16. In a photoelectric conversion device 1600 illustrated in FIG. 16, the photoelectric conversion element 301, the resistor 601, the first diode element 303, the second diode element 603, the first amplifier circuit 1101, the second amplifier circuit 1102, the resistor 701, the operational amplifier 702, the first n-channel transistor 304, the second n-channel transistor 305, the first n-channel transistor 604, the second n-channel transistor 605, the resistor 1501, and the output circuit 104 are illustrated. Note that in FIG. 16, a terminal to which the high power supply potential Vdd is applied, a terminal to which the low power supply potential Vss is applied, and a terminal for outputting the voltage $V_{out}$ obtained in the photoelectric conversion device to the outside are also illustrated.

As described in the above embodiment, in the structure of the photoelectric conversion device of this embodiment, a photoelectric conversion device can be obtained in which output can be obtained by reducing the adverse effect of fluctuation in the output due to the temperature dependence of a diode element for logarithmic compression. Further, in the structure of the photoelectric conversion device of the present invention, by fixing output with the illuminance of light which is used for irradiation of a photoelectric conversion element made lower than or equal to reference illuminance, constant output can be obtained even in the case where weak light which is less than the lower limit of detection of the photoelectric conversion element is detected. Further, in particular, since voltage which is input to an operational amplifier can be amplified and output in the first amplifier circuit and the second amplifier circuit described in this embodiment, the operational amplifier can be operated stably.

In addition, in this embodiment, by providing the first diode element 303 and the second diode element 603 adjacent to each other as illustrated in the layout of each circuit included in the photoelectric conversion device, a photoelectric conversion device can be obtained in which the adverse effect of fluctuation in output due to the temperature dependence of a diode element for logarithmic compression can be further reduced.

Note that the contents described in each drawing in this embodiment can be freely combined with or replaced with the contents described in any of other embodiments as appropriate.

Embodiment 5

In this embodiment, a method for manufacturing a photoelectric conversion device is specifically described. Note that although a lateral-unction PIN photodiode, a thin film transistor (TFT), a longitudinal-junction PIN photodiode, a resistor, and a capacitor are illustrated as examples of semiconductor elements in this embodiment, elements used in the photoelectric conversion device of this embodiment are not limited to these elements. For example, a memory element, an inductor, or the like can be used. In diagrams illustrated in FIGS. 17A and 17B, FIGS. 18A and 181B, FIGS. 19A and 19B, FIGS. 20A and 20B, FIGS. 21A and 21B, and FIGS. 22A and 22B, FIG. 17A, FIG. 18A, FIG. 19A, FIG. 20A, FIG. 21A, and FIG. 22A are top views, and FIG. 177B, FIG. 18B, FIG. 19B, FIG. 20B, FIG. 21B, and FIG. 22B are cross sectional views of the top views in FIG. 17A, FIG. 18A, FIG. 19A, FIG. 20A, FIG. 21A, and FIG. 22A. In the cross-sectional views of FIG. 17B, FIG. 11B, FIG. 19B, FIG. 20B, FIG. 21B, and FIG. 22B, the scale of the elements is changed from the actual size for illustrative purposes.

Figure 17A:
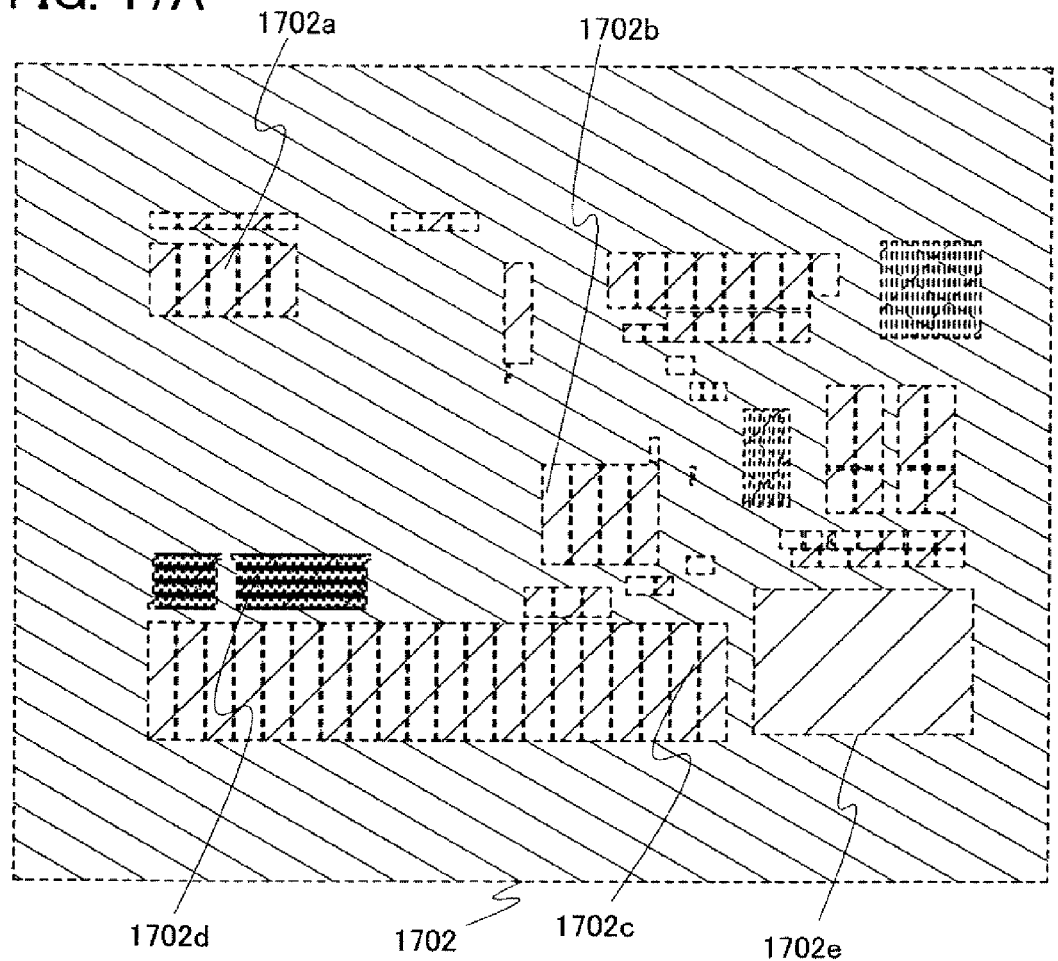
FIGS. 17A and 17B are a top view and a cross-sectional view for illustrating Embodiment 5.
Figure 17B:
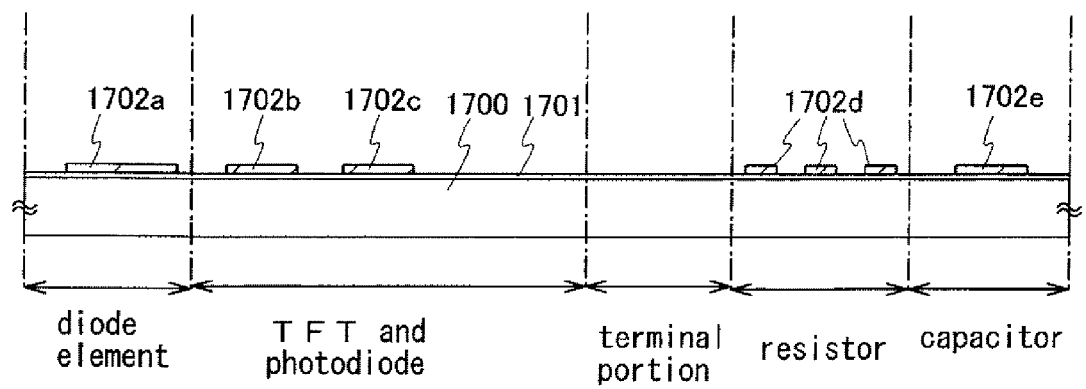

First, an insulating film 1701 and a semiconductor film 1702 are sequentially formed over a light-transmitting substrate 1700. Note that after the semiconductor film 1702 is formed, treatment such as crystallization is performed. Then, the semiconductor film 1702 is processed (patterned) to have a desired shape by etching, so that semiconductor films 1702a to 1702e which are separated to have island shapes can be obtained, as illustrated in FIG. 17B (FIGS. 17A and 17B). The insulating film 1701 and the semiconductor film 1702 can be sequentially formed without being exposed to the air. Note that the layout of the semiconductor films 1702a to 1702e corresponds to the layout illustrated in FIG. 16, and the functions of the semiconductor films are for realizing the functions described in the above embodiment. In the semiconductor film 1702d used for a resistor, the resistor is formed by extending the semiconductor film, as illustrated in FIG. 17A.

As the substrate 1700, for example, a glass substrate such as a barium borosilicate glass substrate or an aluminoborosilicate glass substrate, a quartz substrate, or the like can be used. Although a flexible substrate formed using a synthetic resin such as plastics generally tends to have lower allowable temperature limit than the above substrate, such a flexible substrate can be used as long as it can withstand processing temperature in manufacturing steps. In this embodiment, as the substrate 1700, a 0.5-mm-thick aluminosilicate glass substrate, which is a non-alkali glass substrate, (manufactured by Asahi Glass Co., Ltd. (trade name: AN100)) is used.

The insulating film 1701 is provided in order that alkali metal such as Na or alkaline earth metal contained in the substrate 1700 can be prevented from diffusing into the semiconductor film 1702 and adversely affecting characteristics of a semiconductor element such as a transistor. Thus, it is preferable that the insulating film 1701 be formed using an insulating material having a high barrier property, which can suppress diffusion of alkali metal or alkaline earth metal into the semiconductor film. Note that in the case of using a substrate containing even a small amount of alkali metal or alkaline earth metal, such as a glass substrate or a plastic substrate, it is effective to provide the insulating film 1701 between the substrate 1700 and the semiconductor film from the viewpoint of preventing diffusion of impurities. However, when a substrate in which diffusion of impurities does not lead to a significant problem, such as a quartz substrate, is used as the substrate 1700, the insulating film 1701 is not necessarily provided.

The insulating film 1701 is formed using an insulating material such as silicon oxide, silicon nitride, silicon oxynitride, silicon nitride oxide, or aluminum nitride by CVD, sputtering, or the like.

Note that a silicon oxynitride film refers to a film which contains more oxygen than nitrogen and, in the case where measurement is performed using Rutherford backscattering spectrometry (RBS) and hydrogen forward scattering (HFS), contains oxygen, nitrogen, silicon, and hydrogen at concentrations ranging from 50 to 70 atomic percent, 0.5 to 15 atomic percent, 25 to 35 atomic percent, and 0.1 to 10 atomic percent, respectively. Further, a silicon nitride oxide film refers to a film which contains more nitrogen than oxygen and, in the case where measurement is performed using RBS and HFS, contains oxygen, nitrogen, silicon, and hydrogen at concentrations ranging from 5 to 30 atomic percent, 20 to 55 atomic percent, 25 to 35 atomic percent, and 10 to 25 atomic percent, respectively. Note that percentages of nitrogen, oxygen, silicon, and hydrogen fall within the ranges given above if the total number of atoms contained in silicon oxynitride or silicon nitride oxide is defined as 100 atomic percent.

The insulating film 1701 may be formed using a single insulating film or by stacking a plurality of insulating films. In this embodiment, the insulating film 1701 is formed by sequentially stacking a 50-nm-thick silicon nitride oxide film and a 140-nm-thick silicon oxynitride film. However, the material and the thickness of each film, and the number of stacked layers are not limited to them.

A silicon oxide film can be formed using a mixed gas of silane and oxygen, tetraethoxysilane (TEOS) and oxygen, or the like by a method such as thermal CVD, plasma-enhanced CVD, atmospheric pressure CVD, or bias ECRCVD. Further, typically, a silicon nitride film can be formed using a mixed gas of silane and ammonia by plasma-enhanced CVD. Furthermore, typically, a silicon oxynitride film and a silicon nitride oxide film can be formed using a mixed gas of silane and dinitrogen monoxide by plasma-enhanced CVD.

The semiconductor film 1702 is preferably formed without being exposed to the air after forming the insulating film 1701. The thickness of the semiconductor film 1702 is greater than or equal to 20 nm and less than or equal to 200 nm (preferably greater than or equal to 40 nm and less than or equal to 170 nm, more preferably greater than or equal to 50 nm and less than or equal to 150 nm). Note that the semiconductor film 1702 can be formed using an amorphous semiconductor, a microcrystalline (semi-amorphous or microcrystal) semiconductor, or the like. The semiconductor film 1702 can be formed by sputtering, LPCVD, plasma-enhanced CVD, or the like.

Alternatively, a transistor may be formed by using a light-transmitting substrate having an SOI structure or the like and by using a single crystal semiconductor for the semiconductor film 1702. Thus, a transistor with few variations in characteristics, sizes, shapes, or the like, with high current supply capability, and with a small size can be formed. By using such a transistor, power consumption of a circuit can be reduced or a circuit can be highly integrated.

Alternatively, as well as a simple substance such as silicon (Si) or germanium (Ge), a compound semiconductor such as GaAs, InP; SiC, ZnSe, GaN, or SiGe can be used as a material for the semiconductor used for the semiconductor film. Alternatively, an oxide semiconductor such as zinc oxide (Zn(O)) or tin oxide ($SnO_2$) can be used. In the case of using ZnO for the semiconductor film, a gate insulating film may be formed using $Y_2O_3$, $Al_2O_3$, $TiO_2$, a stack thereof or the like, and a gate electrode and a conductive film which is in contact with the semiconductor film may be formed using ITO, Au, Ti, or the like.

For example, in the case of using silicon as the semiconductor, an amorphous semiconductor film can be formed by glow discharge decomposition of a gas containing silicon.

Examples of a gas containing silicon are $SiH_4$ and $Si_2H_6$. The gas containing silicon may be diluted with hydrogen or hydrogen and helium.

A microcrystalline semiconductor belongs to an intermediate metastable state between an amorphous semiconductor and a single crystal semiconductor taking Gibbs free energy into consideration. That is, the microcrystalline semiconductor is a semiconductor having a third state which is stable in free energy, a short-range order, and lattice distortion. Columnar-like or needle-like crystals grow in a normal direction with respect to a substrate surface. The Raman spectrum of microcrystalline silicon, which is a typical example of a microcrystalline semiconductor, shifts to the lower wavenumber side than 520 $cm^{-1}$ which represents single crystal silicon. In other words, the peak of the Raman spectrum of the microcrystalline silicon is between 520 $cm^{-1}$ which represents single crystal silicon and 480 $cm^{-1}$ which represents amorphous silicon. The microcrystalline silicon contains hydrogen or halogen at a concentration of at least 1 atomic percent to terminate a dangling bond. Further, by containing a rare gas element such as helium, argon, krypton, or neon so that lattice distortion is further promoted, stability is improved and a favorable microcrystalline semiconductor film can be obtained.

The microcrystalline semiconductor film can be formed by high-frequency plasma-enhanced CVD with a frequency of several tens to several hundreds of megahertz or a microwave plasma CVD apparatus with a frequency higher than or equal to 1 GHz. Typically, the microcrystalline semiconductor film can be formed using a dilution of a compound containing silicon, such as $SiH_4$, $Si_2H_6$, $SiH_2Cl_2$, $SiHCl_3$, $SiCl_4$, or $SiF_4$ with hydrogen. Alternatively, the microcrystalline semiconductor film can be formed by dilution with one or plural kinds of rare gas elements selected from helium, argon, krypton, or neon in addition to the compound containing silicon and hydrogen. The flow rate ratio of hydrogen to the compound containing silicon, such as silicon hydride, in this case is set to be greater than or equal to 5:1 and less than or equal to 200:1, preferably greater than or equal to 50:1 and less than or equal to 150:1, more preferably 100:1.

A semiconductor film including a polycrystalline semiconductor can be formed by performing laser crystallization, thermal crystallization, thermal crystallization in which a catalytic element which promotes crystallization, such as nickel, is used, or the like alone, or performing any of the above methods in combination on an amorphous semiconductor film or a microcrystalline semiconductor film. Alternatively, a polycrystalline semiconductor may be formed directly by sputtering, plasma-enhanced CVD, thermal CVD, or the like. Alternatively, the polycrystalline semiconductor may be selectively formed over the substrate by a plasma method. In the case of performing laser crystallization without introducing a catalytic element which promotes crystallization, in order to prevent generation of a phenomenon in which the amorphous semiconductor film scatter due to laser light irradiation (ablation), the amorphous semiconductor film is heated at 500° for 1 hour in a nitrogen atmosphere so that the concentration of hydrogen contained in the amorphous semiconductor film is lower than or equal to $1\times10^{20}$ atoms/$cm^3$ before the amorphous semiconductor film is irradiated with laser light. For example, in the case of forming a polycrystalline semiconductor film by using laser crystallization, heat treatment at 550° C. for 4 hours is performed on the semiconductor film before the laser crystallization in order to improve resistance of the semiconductor film with respect to laser. A crystal with a large grain size can be obtained by irradiation with laser light having one of the second, third, and fourth harmonics of a fundamental wave by using a continuous-wave solid-state laser. Typically, for example, the second (532 nm) harmonic or the third (355 nm) harmonic of an Nd:$YVO_4$ laser (having a fundamental wave of 1064 nm) is preferably used. Specifically, the laser light emitted from the continuous wave $YVO_4$ laser is converted into the harmonic by a non-linear optical element so that laser light having an output of 10 W is obtained. The laser light is preferably shaped into a rectangular or elliptical shape on an irradiated surface by an optical system and is emitted to the semiconductor film. The power density in this case needs to be approximately 0.01 to 100 MW/$cm^2$ (preferably 0.1 to 10 MW/$cm^2$). The scan rate is set to approximately 10 to 200 cm/sec for the irradiation.

As a continuous-wave gas laser, an Ar laser, a Kr laser, or the like can be used. As a continuous-wave solid-state laser, a YAG laser, a $YVO_4$ laser, a YLF laser, a $YAlO_3$ laser, a forsterite ($Mg_2SiO_4$) laser, a $GdVO_4$ laser, a $Y_2O_3$ laser, a glass laser, a ruby laser, an alexandrite laser, a Ti:sapphire laser, or the like can be used.

As a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example.

Alternatively, laser crystallization may be performed using pulsed laser light having a pulse repetition rate higher than or equal 10 MHz. The repetition rate thereof is extremely higher than the frequency band of several tens of hertz to several hundreds of hertz, which is usually used. It is said that the time between irradiation with pulsed laser light and complete solidification of the semiconductor film is several ten to several hundred nanoseconds. Thus, when the pulsed laser light has the above repetition rate, the semiconductor film can be irradiated with laser light of the next pulse before the semiconductor film melted by preceding laser light is solidified. Therefore, since a solid-liquid interface can be continuously moved in the semiconductor film, a semiconductor film having crystal grains grown continuously in a scan direction is formed. Specifically, an aggregate of crystal grains having widths of approximately 10 to 30 µm in the scan direction and widths of approximately 1 to 5 µm in a direction perpendicular to the scan direction can be formed. By forming such crystal grains of single crystal, which are grown continuously in the scan direction, a semiconductor film having few grain boundaries at least in a channel direction of a TFT can be formed.

Note that the laser crystallization can be performed by irradiation with a fundamental wave of continuous-wave laser light and a harmonic of the continuous-wave laser light in parallel. Alternatively, the laser crystallization may be performed by irradiation with a fundamental wave of continuous-wave laser light and a harmonic of pulsed laser light in parallel.

Note that laser irradiation may be performed in an inert gas atmosphere such as a rare gas or a nitrogen gas. Thus, roughness of a semiconductor surface due to laser light irradiation can be suppressed, and variation in threshold voltage due to variation in interface state density can be suppressed.

In the case of using thermal crystallization using a catalytic element which promotes crystallization, a method for introducing the catalytic element into the amorphous semiconductor film is not particularly limited to a certain method as long as the catalytic element can be introduced onto a surface of or inside the amorphous semiconductor film. For example, sputtering, CVD, plasma treatment (also including plasma-enhanced CVD), an adsorption method, or a method of applying a solution of metal salt can be used. Among them, the method of using a solution is easy and can easily adjust the concentration of the catalytic element. Further, it is preferable that an oxide film be formed by UV light irradiation in an oxygen atmosphere, thermal oxidation, treatment with ozone water or hydrogen peroxide containing a hydroxyl radical, or the like, in order to improve the wettability of the surface of the amorphous semiconductor layer and to spread the aqueous solution over the entire surface of the amorphous semiconductor layer.

After the catalytic element is introduced into the amorphous semiconductor film, by performing heat treatment (at higher than or equal to 550° C. and lower than or equal to 750° C. for 3 minutes to 24 hours), the polycrystalline semiconductor film can be formed. As the catalytic element which promotes the crystallization, one or plural kinds of elements selected from iron (Fe), nickel (Ai), cobalt (Co), ruthenium (Ru), rhodium (h), palladium (Pd), osmium (Os), iridium (Ir), platinum (Pt), copper (Cu), and gold (Au) can be used.

After performing the above crystallization, the catalytic element which promotes the crystallization is removed from the polycrystalline semiconductor film, and a semiconductor film which contains an impurity element is formed so as to be in contact with the polycrystalline semiconductor film in order to lower the concentration of the catalytic element. The semiconductor film which contains the above impurity element serves as a gettering sink. As the impurity element, an impurity element which imparts n-type conductivity, an impurity element which imparts p-type conductivity, or a rare gas element can be used. For example, one or plural kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. Then, a semiconductor film containing a rare gas element is formed so as to be in contact with the polycrystalline semiconductor film containing the catalytic element which promotes the crystallization, and heat treatment (at higher than or equal to 550° C. and lower than or equal to 750° C. for 3 minutes to 24 hours) is performed. With the above treatment, the catalytic element which is contained in the polycrystalline semiconductor film and promotes the crystallization is moved into the semiconductor film containing the rare gas element, so that the concentration of the catalytic element which promotes the crystallization in the polycrystalline semiconductor film is lowered. After that, the semiconductor film containing the rare gas element, which serves as the gettering sink, is removed.

In this embodiment, a semiconductor film is formed using polycrystalline silicon by combining crystallization using a catalytic element and laser crystallization. A specific method for manufacturing a semiconductor film in this embodiment is described below.

In this embodiment, first, a 50-nm-thick amorphous silicon film is formed over the insulating film 1701. Then, a nickel acetate solution containing 10 ppm by weight of nickel is applied to the amorphous silicon film by a spinner. Note that a method by which a nickel element is dispersed over the entire surface by sputtering may be used instead of a method by which the catalytic element is added using the solution. Next, after heat treatment (at 500° C. for 1 hour), by performing heat treatment for crystallization (at 550° C. for 4 hours) so that the amorphous silicon film is crystallized, the semiconductor film containing polycrystalline silicon is formed.

Next, the oxide film formed on the surface of the semiconductor film containing polycrystalline silicon is removed with dilute hydrofluoric acid. After that, irradiation with laser light (XeCl: a wavelength of 308 nm) for increasing the degree of crystallization and reducing defects left in crystal grains is performed in the atmosphere or an oxygen atmosphere.

Excimer laser light having a wavelength less than or equal to 400 nm, or the second harmonic or the third harmonic of a YAG laser is used for the laser light. Here, pulsed laser light having a repetition rate of approximately 10 to 1000 Hz is used. The laser light is condensed to greater than or equal to 100 mJ/cm$^2$ and less than or equal to 500 mJ/cm$^2$ by an optical system, and irradiation is performed with an overlap rate higher than or equal to 90% and lower than or equal to 95%, thereby scanning the surface of the silicon film. In this embodiment, irradiation with laser light having a repetition rate of 30 Hz and an energy density of 470 mJ/cm$^2$ is performed in the atmosphere.

Note that since the laser light irradiation is performed in the atmosphere or an oxygen atmosphere, an oxide film is formed on the surface by the laser light irradiation. Note that although an example where the pulsed laser is used is illustrated in this embodiment, a continuous wave laser may be used. In order to obtain a crystal with a large grain size in crystallizing the semiconductor film, it is preferable to use a continuous-wave solid-state laser and any one of the second to fourth harmonics of a fundamental wave. Typically, the second harmonic (532 mm) or the third harmonic (355 nm) of an Nd; YVO$_4$ laser (a fundamental wave of 1064 nm) may be used.

In the case of using a continuous wave laser, laser light emitted from the continuous wave YVO$_4$ laser having an output of 10 W is converted into harmonics by using a non-linear optical element. Alternatively, the harmonics are obtained by putting a YVO$_4$ crystal and a non-linear optical element in a resonator. Then, the laser light having a rectangular shape or an elliptical shape on an irradiated face is preferably shaped by an optical system, and an object is irradiated with this laser light. The power density in this case needs to be approximately 0.01 to 100 MW/cm$^2$ (preferably 0.1 to 10 MW/cm$^2$). Then, irradiation with the laser light is performed by moving the semiconductor film relatively to the laser light at a rate of approximately 10 to 2000 cm/s.

Next, in addition to the oxide film formed by the laser light irradiation, a barrier layer formed using an oxide film having a thickness greater than or equal to 1 nm and less than or equal to 5 nm in total is formed on the surface of the polycrystalline semiconductor film by processing the surface of the polycrystalline semiconductor film after the laser crystallization with ozone water for 120 seconds. The barrier layer is formed in order to remove the catalytic element, which is added for crystallization, such as nickel (Ni), from the polycrystalline semiconductor film. Although the barrier layer is formed by using ozone water here, the barrier layer may be formed by depositing an oxide film having a thickness of approximately 1 to 10 nm by using a method of oxidizing a surface of a semiconductor film having a crystal structure by UV light irradiation in an oxygen atmosphere, a method of oxidizing a surface of a semiconductor film having a crystal structure by oxygen plasma treatment, plasma-enhanced CVD, sputtering, evaporation, or the like. In addition, before forming the barrier layer, the oxide film formed by the laser light irradiation may be removed.

Next, over the barrier layer, an amorphous silicon film containing an argon element, which serves as a gettering site, is formed to a thickness greater than or equal to 10 nm and less than or equal to 400 nm, for example, 100 mm here, by sputtering, Here, the amorphous silicon film containing an argon element is formed in an atmosphere containing argon by using a silicon target. In the case of forming the amorphous silicon film containing an argon element by plasma-enhanced CVD, the amorphous silicon film containing an argon element is formed under the following deposition conditions: a monosilane/argon (SiH$_4$:Ar) flow ratio of 1:99; a deposition pressure of 6.665 Pa; an RF power density of 0.087 W/cm$^2$; and a deposition temperature of 350° C.

After that, a furnace heated to 650° C. is used for heat treatment for 3 minutes so that the catalytic element is removed (gettering). Accordingly, the concentration of the catalytic element in the semiconductor film having a crystal structure is lowered. A lamp annealing apparatus may be used instead of the furnace.

Next, after the amorphous silicon film containing an argon element, which is the gettering site, is selectively removed using the barrier layer as an etching stopper, the barrier layer is selectively removed with dilute hydrofluoric acid. Note that since nickel tends to move to a region with a high concentration of oxygen in gettering, the barrier layer formed using an oxide film is preferably removed after the gettering.

When the semiconductor film is not crystallized using a catalytic element, the above steps including the formation of a barrier layer, the formation of a gettering site, heat treatment for gettering, removal of the gettering site, removal of the barrier layer, and the like are not necessary.

Figure 18A:
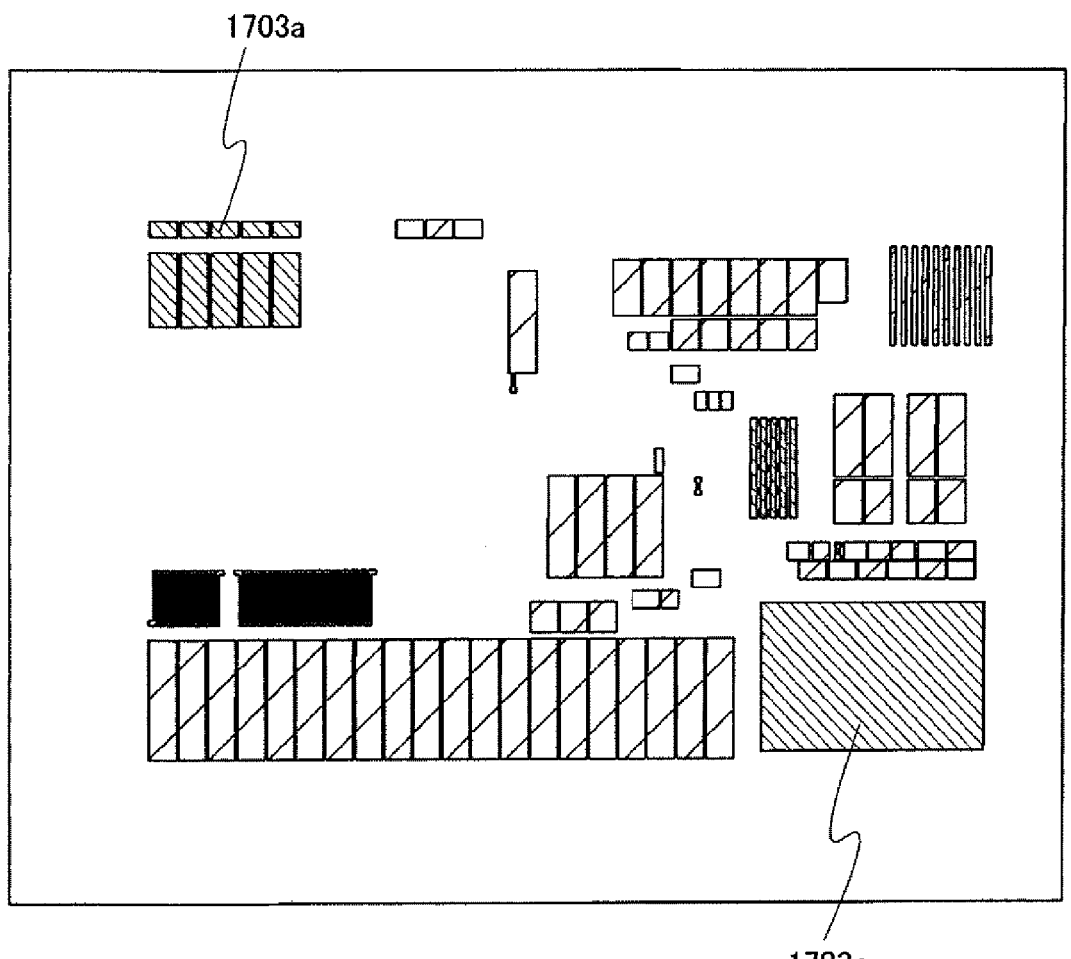
FIGS. 18A and 18B are a top view and a cross-sectional view for illustrating Embodiment 5.
Figure 18B:
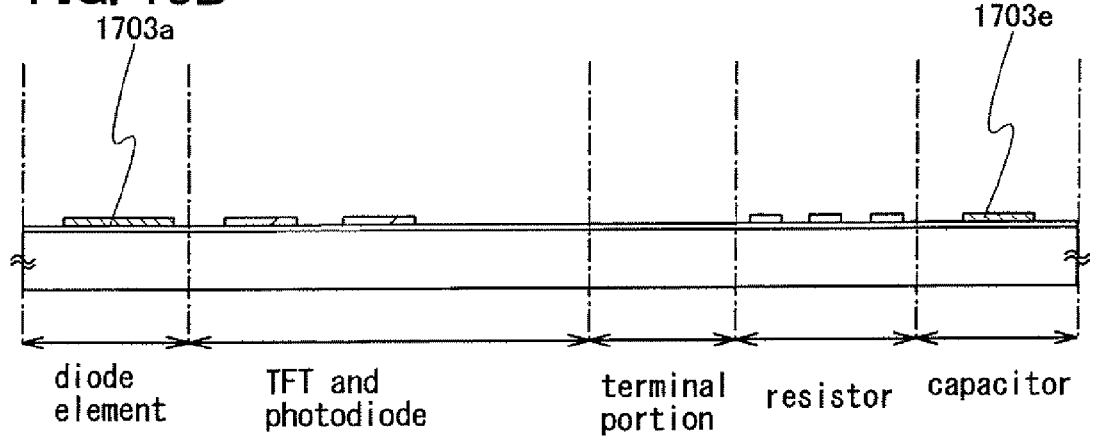

After forming the semiconductor film, as illustrated in FIGS. 18A and 18B, an impurity element which imparts p-type conductivity and an impurity element which imparts n-type conductivity are added to the semiconductor film 1702a used for the diode element and the semiconductor film 1702e used for the capacitor at low concentration so that a low-concentration impurity region 1703a and a low-concentration impurity region 1703e are formed. The addition of the impurity element may be performed on the whole semiconductor film or may be selectively performed on part of the semiconductor film. Note that this addition of the impurity element may be doubled as addition of an impurity element for channel doping to the semiconductor film 1702b and 1702c used for the TFT. As the impurity element which imparts p-type conductivity, boron (B), aluminum (Al), gallium (Ga), or the like can be used. As the impurity element which imparts n-type conductivity, phosphorus (P), arsenic (As), or the like can be used. Here, boron (B) is used as the impurity element and is added so as to be contained at a concentration higher than or equal to $1 \times 10^{16}$/cm$^3$ and lower than or equal to $5 \times 10^{17}$/cm$^3$.

Note that the addition of the impurity element may be performed not on the semiconductor films 1702a to 1702e which are formed to have island shapes but on the semiconductor film 1702 before the island shapes are formed.

Figure 19A:
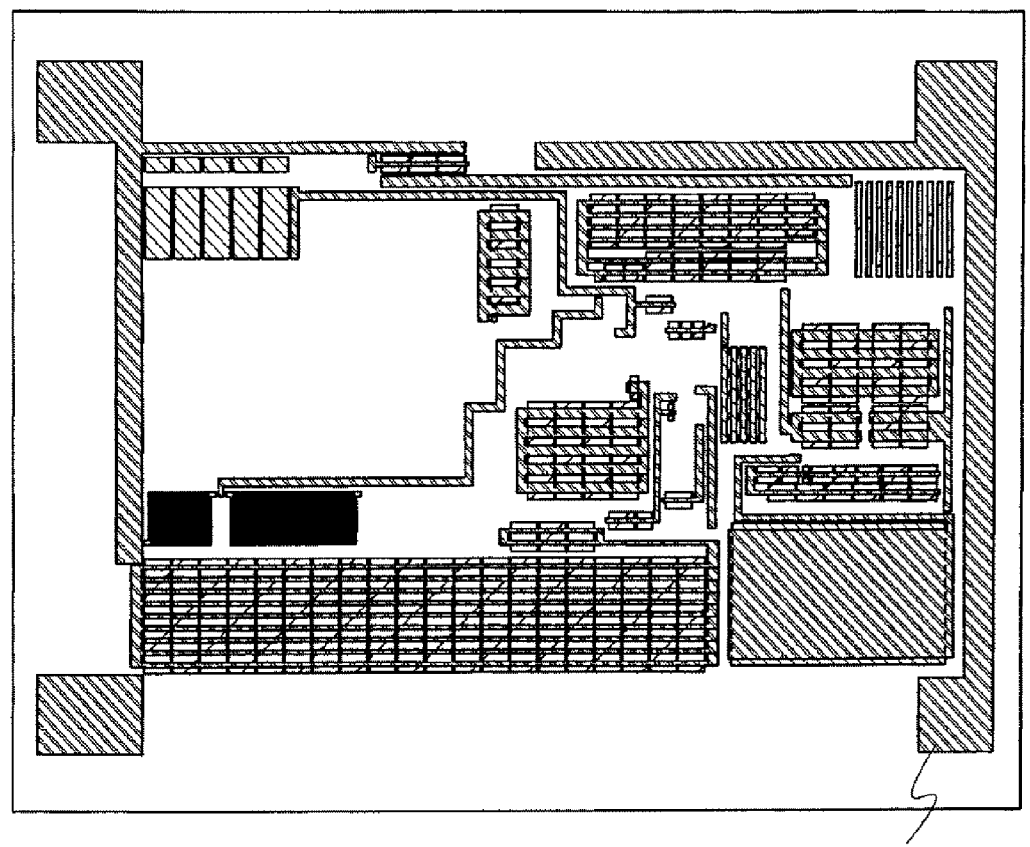
FIGS. 19A and 19B are a top view and a cross-sectional view for illustrating Embodiment 5.
Figure 19B:
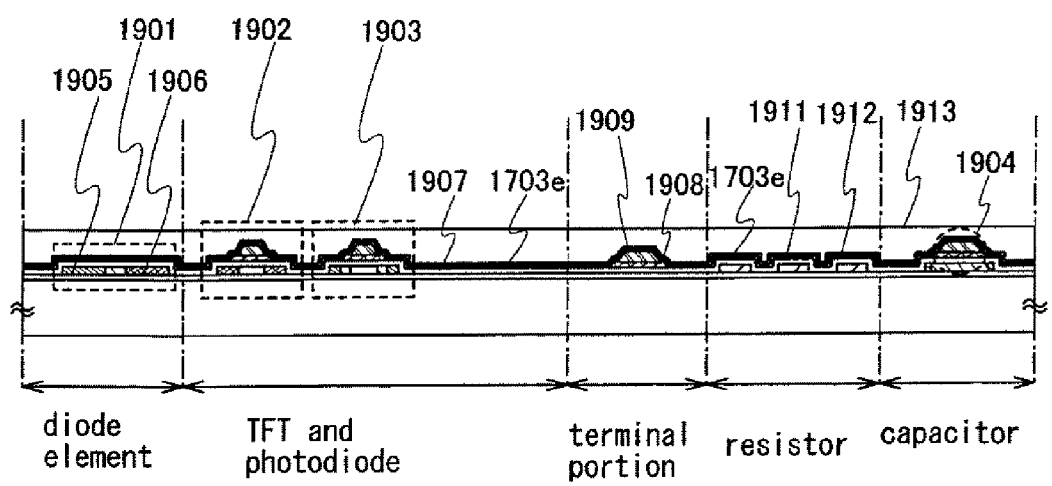

Next, as illustrated in FIGS. 19A and 19B, a diode element 1901 is formed using the semiconductor film 1702a. In addition, a p-channel transistor 1902 and an n-channel transistor 1903 are formed using the semiconductor film 1702b and the semiconductor film 1702c. Further, a capacitor 1904 formed by holding an insulating layer with conductive layers is formed using the semiconductor film 1702e.

Specifically, as the diode element 1901, the low-concentration impurity region 1703a is interposed between an impurity region to which n-type conductivity is imparted (hereinafter referred to as an n-type impurity region 1905) and an impurity region to which p-type conductivity is imparted (referred to as a p-type impurity region 1906). That is, a lateral-junction PIN diode is formed in which a region having p-type conductivity, a region having i-type conductivity, and a region having n-type conductivity are sequentially provided so as to be adjacent to each other.

Specifically, for the p-channel transistor 1902 and the n-channel transistor 1903, a gate insulating film 1907 is formed so as to cover the insulating films 1702a to 1702e.

Then, over the gate insulating film 1907, a conductive film 1908 and a conductive film 1909 each processed (patterned) to have a desired shape are formed. Note that the conductive film 1908 and the conductive film 1909 are also formed over the low-concentration impurity region 1703e used for a terminal portion and the capacitor. The conductive film 1908 and the conductive film 1909 are sequentially formed over the gate insulating film 1907. Part of the conductive film 1908 and the conductive film 1909, which overlaps with the semiconductor film 1702b, serves as a first wiring layer 1910 which corresponds to a gate electrode of the p-channel transistor 1902. In addition, part of the conductive film 1908 and the conductive film 1909, which is used for the terminal portion, serves as the first wiring layer 1910 for electrically connecting elements in the photoelectric conversion device to each other. Further, part of the conductive film 1908 and the conductive film 1909, which overlap with the semiconductor film 1702b, serves as the first wiring layer 1910 which also serves as one of electrodes of the capacitor 1904.

Then, by adding an impurity which imparts n-type conductivity or p-type conductivity to the semiconductor films 1702a to 1702e by using the first wiring layer 1910 and a resist on which pattering is performed are used as masks, impurity regions or the like which serves as a source region, a drain region, and an LDD region of a transistor are formed. Note that in FIG. 19B, by adding the impurity element which imparts conductivity to the other of the electrodes of the capacitor as well as the source region and the drain region of the transistor, the function as the electrode of the capacitor is provided. Note that as the impurity which imparts n-type conductivity, which is added to the semiconductor films 1702a to 1702c, phosphorus (P), arsenic (As), or the like can be used, for example. In addition, as the impurity which imparts p-type conductivity, which is added to the semiconductor films 1702a to 1702e, boron (B) or the like can be used, for example Note that the gate insulating film 1907 can be formed using a single layer of silicon oxide film, a silicon nitride film, a silicon oxynitride film, or a silicon nitride oxide film or by stacking any of a silicon oxide film, a silicon nitride film, a silicon oxynitride film, and a silicon nitride oxide film, for example. In the case of forming the gate insulating film 1907 by stacking films, it is preferable to use a three-layer structure in which a silicon oxide film, a silicon nitride film, and a silicon oxide film are sequentially stacked from the substrate 1700 side, for example. Further, the gate insulating film 1907 can be formed by plasma-enhanced CVD, low-pressure CVD, sputtering, or the like. For example, in the case where the gate insulating film 1907 using silicon oxide is formed by plasma-enhanced CVD, the gate insulating film 1907 is formed under the following conditions: a gas in which tetraethyl orthosilicate (TEOS) and O$_2$ are mixed; a reaction pressure of 40 Pa; a substrate temperature higher than or equal to 300° C. and lower than or equal to 400° C.; and a high-frequency (13.56 MHz) power density of higher than or equal to 0.5 W/cm$^2$ and lower than or equal to 0.8 W/cm$^2$.

The gate insulating film 1907 may be formed by oxidizing or nitriding surfaces of the semiconductor films 1702a to 1702e by high-density plasma treatment. The high-density plasma treatment is performed using, for example, a mixed gas of a rare gas such as He, Ar, Kr, or Xe; and oxygen, nitrogen oxide, ammonia, nitrogen, or hydrogen. In this case, by exciting plasma by introduction of microwaves, plasma with a low electron temperature and high density can be generated. By oxidizing or nitriding the surfaces of the semiconductor films 1702a to 1702e with oxygen radicals (including OH radicals in some cases) or nitrogen radicals (including NH radicals in some cases) generated by such high-density plasma, an insulating film having a thickness greater than or equal to 1 nm and less than or equal to 20 nm, typically greater than or equal to 5 nm and less than or equal to 10 nm is formed so as to be in contact with the semiconductor films 1702a to 1702e. The insulating film having a thickness greater than or equal to 5 nm and less than or equal to 10 nm may be used as the gate insulating film 1907.

Oxidation or nitriding of the semiconductor films by the above high-density plasma treatment proceeds by solid-phase reaction. Therefore, interface state density between the gate insulating film and the semiconductor films can be made quite low. Further, by directly oxidizing or nitriding the semiconductor films by high-density plasma treatment, variation in thickness of the insulating film to be formed can be suppressed. Further, in the case where the semiconductor films have crystallinity, by oxidizing the surfaces of the semiconductor films by solid-phase reaction by high-density plasma treatment, crystal grain boundaries can be prevented from being locally oxidized at fast speed. Thus, a uniform gate insulating film with low interface state density can be formed. Variation in characteristics of a transistor whose gate insulating film partly or entirely includes an insulating film formed by high-density plasma treatment can be suppressed.

Alternatively, aluminum nitride can be used for the gate insulating film 1907. Aluminum nitride has comparatively high thermal conductivity and can efficiently diffuse heat generated in a transistor. Alternatively, after silicon oxide, silicon oxynitride, or the like which does not contain aluminum is formed, aluminum nitride may be stacked thereon to be used for the gate insulating film.

In this embodiment, the 30-nm-thick gate insulating film 1907 containing silicon oxynitride is formed using nitrous oxide ($N_2O$) and silane ($SiH_4$) at a pressure higher than or equal to 10 Pa and lower than or equal to 30 Pa and a microwave (2.45 GHz) power higher than or equal to 3 kW and lower than or equal to 5 kW by vapor deposition. By combining solid phase reaction and reaction due to vapor deposition, the gate insulating film 1907 having low interface state density and high withstand voltage can be formed.

Alternatively, for the gate insulating film 1907, a high dielectric constant material such as zirconium dioxide, hafnium oxide, titanium dioxide, or tantalum pentoxide may be used. By using a high dielectric constant material for the gate insulating film 1907, the amount of gate leakage current can be reduced.

Further, although the first wiring layer 1910 is formed using the two conductive films 1908 and 1909 which are stacked in this embodiment, the structure of the first wiring layer 1910 is not limited to this. Instead of the conductive films 1908 and 1909, the first wiring layer 1910 may be formed using a single-layer conductive film, or may be formed using three or more conductive films which are stacked. In the case of using a three-layer structure in which three or more conductive films are stacked, a layered structure of a molybdenum film, an aluminum film, and a molybdenum film is preferably used.

For the conductive film used for the first wiring layer 1910, tantalum (Ta), tungsten (W), titanium (Ti), molybdenum (Mo), aluminum (Al), copper (Cu), chromium (Cr), niobium (Nb), neodymium (Nd), cobalt (Co), zirconium (Zr), zinc (Zn), ruthenium (Ru), rhodium (Rh), palladium (Pd), osmium (Os), iridium (Ir), platinum (Pt), gold (Au), silver (Ag), or the like can be used. Alternatively, either an alloy containing the above metal as its main component or a compound containing the above metal may be used. Alternatively, the conductive film may be formed using a semiconductor such as polycrystalline silicon, in which a semiconductor film is doped with an impurity element which imparts conductivity, such as phosphorus.

Alternatively, for the conductive film used for the first wiring layer 1910, a conductive material having light transmitting properties with respect to visible light can be used. As the light-transmitting conductive material, indium tin oxide (ITO), indium tin oxide containing silicon oxide (ITSO), organic indium, organic tin, zinc oxide, or the like can be used. Alternatively, for the conductive film used for the first wiring layer 1910, indium zinc oxide (IZO) containing zinc oxide, zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

In this embodiment, tantalum nitride or tantalum (Ta) is used for the first conductive film 1908 and tungsten (W) is used for the second conductive film 410. As well as the example illustrated in this embodiment, any of the following combination of the two conductive films can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step after the two conductive films are formed. Alternatively, as the combination of the second conductive film, for example, nickel silicide and silicon doped with an impurity which imparts n-type conductivity, WSix and silicon doped with an impurity which imparts n-type conductivity, or the like can be used.

The conductive films 1908 and 1909 can be formed by CVD, sputtering, or the like. In the case of forming the first wiring layer 1910 by using the above two conductive films, the first conductive film 1908 is formed to a thickness greater than or equal to 20 nm and less than or equal to 100 nm, and the second conductive film 1909 is formed to a thickness greater than or equal to 100 nm and less than or equal to 400 nm. In this embodiment, the first conductive film 1908 containing tantalum nitride or tantalum (Ta) is formed to a thickness of 30 nm, and the second conductive film 1909 containing tungsten (W) is formed to a thickness of 170 nm.

Note that as a mask used for forming the first wiring layer 1910, silicon oxide, silicon oxynitride, or the like may be used instead of a resist. In this case, a step of forming the mask using silicon oxide, silicon oxynitride, or the like by patterning is additionally needed; however, the thickness of the mask is less reduced in etching as compared to the resist, so that the first wiring layer 1910 with a desired shape can be formed. Alternatively, the gate wiring layer 1910 may be selectively formed by a droplet discharge method without using a mask. Note that a droplet discharge method refers to a method of forming a predetermined pattern by discharging or ejecting a droplet containing a predetermined composition from an orifice, and includes an inkjet method in its category.

Note that in the case of forming the first wiring layer 1910, an optimal etching method and an optimal kind of etchant are selected as appropriate depending on materials used for the conductive films. An example of an etching method in the case where tantalum nitride is used for the first conductive film 1908 and tungsten is used for the second conductive film 1909 is specifically described below.

First, after a tantalum nitride film is formed, a tungsten film is formed over the tantalum nitride film. Then, a mask is formed over the tungsten film and first etching is performed. In the first etching, etching is performed under a first etching condition, and then, under a second etching condition. In the first etching condition, etching is performed as follows: inductively coupled plasma (ICP) etching is used; $CF_4$, $Cl_2$, and $O_2$ are used for an etching gas with a flow ratio of 25:25:10 (sccm); and an RF (13.56 MHz) power of 500 W is applied to a coiled electrode at a pressure of 1 Pa so that plasma is generated. Then, an RF (13.56 MHz) power of 150 W is applied to the substrate side (sample stage) so that negative self-bias voltage is substantially applied. Under this first etching condition, it is possible to etching the tungsten film so that end portions thereof have tapered shapes.

Next, etching is performed under the second etching condition. In the second etching conduction, etching is performed for approximately 30 seconds as follows: $CF_4$ and $Cl_2$ are used for an etching gas with a flow ratio of 30:30 (sccm); and an RF (13.56 MHz) power of 500 W is applied to a coiled electrode at a pressure of 1 Pa so that plasma is generated. An RF (13.56 MHz) power of 20 W is applied to the substrate side (sample stage) so that negative self-bias voltage is substantially applied. In the second etching condition where $CF_4$ and $Cl_2$ are mixed with each other, the tungsten film and the tantalum nitride film are etched to the same or substantially the same degree.

In the first etching, by using an optimal shape for the mask, the end portions of the tantalum nitride film and the tungsten film have tapered shapes each having an angle greater than or equal to 15° and less than or equal to 45° due to the effect of the bias voltage applied to the substrate side. Note that in the gate insulating film 1907, a portion which is exposed by the first etching is etched to be thinner than other portions which are covered with the tantalum nitride film and the tungsten film depending on the etching condition.

Next, second etching is performed without removing the mask. In the second etching, the tungsten film is selectively etched using $CF_4$, $Cl_2$, and $O_2$ for an etching gas. In this case, the tungsten film is preferentially etched by the second etching; however, the tantalum nitride film is hardly etched.

Through the first etching and the second etching, the conductive film 1908 including tantalum nitride and the conductive film 1909 including tungsten, which has smaller width than the conductive film 1908, can be formed.

Through a series of the above steps, the diode element 1901, the p-channel transistor 1902, the n-channel transistor 1903, and the capacitor 1904 can be formed. Note that the method for manufacturing each element is not limited to having the above process.

Then, as illustrated in FIG. 19B, an insulating film 1911 is formed so as to cover the diode element 1901, the p-channel transistor 1902, the n-channel transistor 1903, the capacitor 1904, the terminal portion, and the resistor. The insulating film 1911 is not necessarily provided; however, by providing the insulating film 1911, an impurity such as alkali metal or alkaline earth metal can be prevented from entering the p-channel transistor 1902 and the n-channel transistor 1903. Specifically, it is preferable to use silicon nitride, silicon nitride oxide, silicon oxynitride, aluminum nitride, aluminum oxide, silicon oxide, or the like for the insulating film 1911. In this embodiment, a silicon oxynitride film having a thickness of approximately 30 nm is formed by CVD and is used as the insulating film 1911.

After the insulating film 1911 is formed, the impurity regions may be activated by heat treatment. For example, heat treatment may be performed at 480° C. for 1 hour in a nitrogen atmosphere, For the heat treatment, thermal annealing using an annealing furnace, laser annealing, rapid thermal annealing (RTA), or the like can be used.

Next, an insulating film 1912 and an insulating film 1913 are sequentially stacked over the insulating film 1911. An organic material having heat resistance, such as acrylic, polyimide, benzocyclobutene, polyamide, or epoxy can be used for the insulating film 1912 and the insulating film 1913. As well as such an organic material, a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like can be used. A siloxane-based resin refers to a material in which a skeleton structure is formed by the bond of silicon (Si) and oxygen (O). As well as hydrogen, at least one of fluorine, a fluoro group, and an organic group (e.g., an alkyl group or aromatic hydrocarbon) may be used as a substituent. Note that the insulating film 1912 and the insulating film 1913 may be formed by stacking a plurality of insulating films formed using any of the above materials.

For the formation of the insulating film 1912 and the insulating film 1913, CVD, sputtering, SOG, spin coating, dip coating, spray coating, a droplet discharge method (e.g., an inkjet method, screen printing, or offset printing), a doctor knife, a roll coater, a curtain coater, a knife coater, or the like can be used depending on the materials of the insulating film 1912 and the insulating film 1913.

In this embodiment, a 100-nm-thick silicon nitride oxide film containing hydrogen, which is formed by CVD, is used as the insulating film 1912, and a 900-nm-thick silicon oxynitride film formed by CVD is used as the insulating film 1913.

Note that although the insulating films 1911 to 1913 serve as interlayer insulating films in this embodiment, a single-layer insulating film may be used as the interlayer insulating film, or an insulating film having two stacked layers or an insulating film having four or more stacked layers may be used as the interlayer insulating film.

In addition, after the insulating film 1912 and the insulating film 1913 are formed, heat treatment is preferably performed at higher than or equal to 300° C. and lower than or equal to 550° C. for 1 to 12 hours. In this embodiment, heat treatment is performed at 410° C. for 1 hour in a nitrogen atmosphere. Through the heat treatment, dangling bonds in the semiconductor films 1702a to 1702e can be terminated with hydrogen contained in the insulating film 1912. For the heat treatment, thermal annealing using an annealing furnace, laser annealing, rapid thermal annealing (RTA), or the like can be used. Through the heat treatment, as well as hydrogenation, activation of the impurity element added to the semiconductor films 1702a to 1702e can be performed. As a different method for performing hydrogenation for terminating the dangling bonds, plasma hydrogenation (using hydrogen excited by plasma) may be performed.

Note that in the case of using an insulating film formed using siloxane as the insulating film 1913, heat treatment for hydrogenating the semiconductor films 1702a to 1702e may be performed after the insulating film 1912 is formed, and then, the insulating film 1913 may be formed.

Note that although a transistor having a single-gate structure is illustrated in this embodiment, a transistor having a multi-gate structure such as a double-gate structure may be used. Alternatively, a transistor or the like formed by an inkjet method or a printing method can be used. Thus, transistors can be formed at room temperature, can be formed at a low vacuum, or can be formed using a large substrate. In addition, since the transistor can be formed without using a mask (a reticle), the layout of the transistor can be easily changed. Further, since it is not necessary to use a resist, material cost is reduced and the number of steps can be reduced. Further, since a film is formed only where needed, a material is not wasted compared to a manufacturing method in which etching is performed after a film is formed over the entire surface, so that cost can be reduced.

Alternatively, a transistor including an organic semiconductor, or the like can be used. Thus, since a transistor can be formed over a flexible substrate, a photoelectric conversion device which can withstand shock can be formed.

Figure 20A:
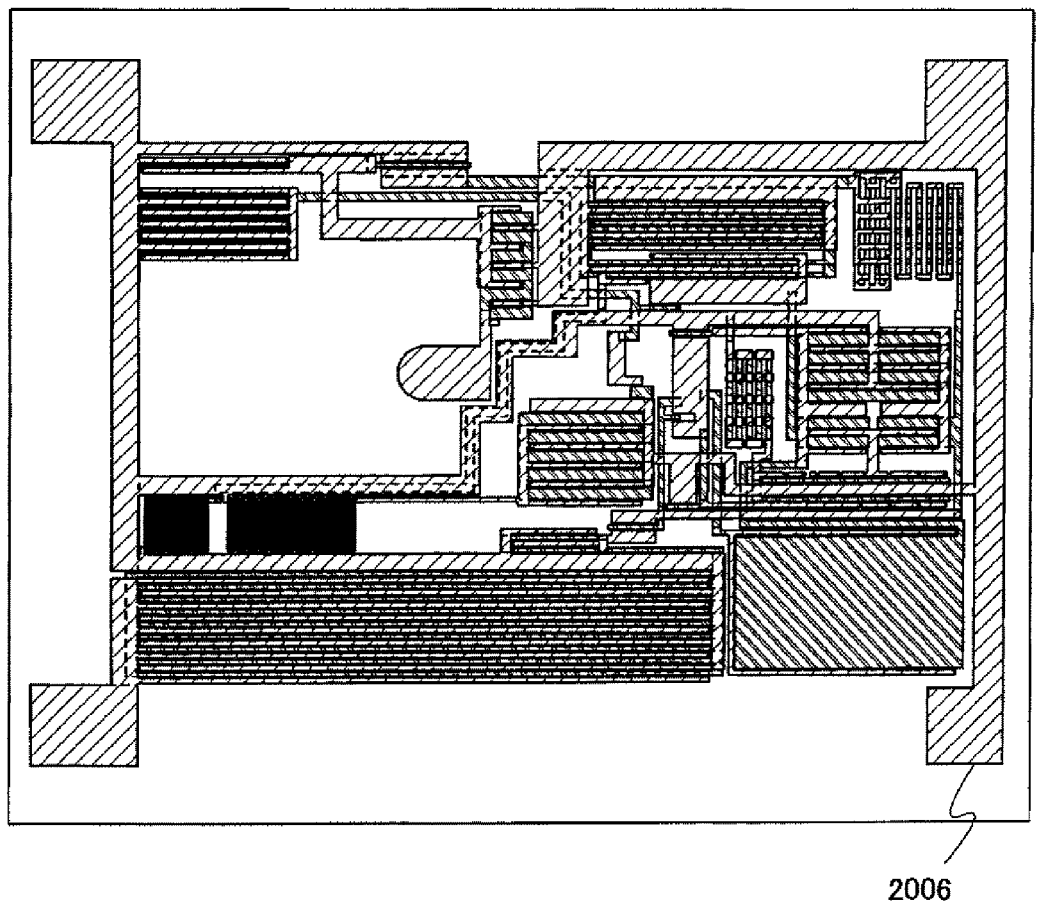
FIGS. 20A and 20B are a top view and a cross-sectional view for illustrating Embodiment 5.
Figure 20B:
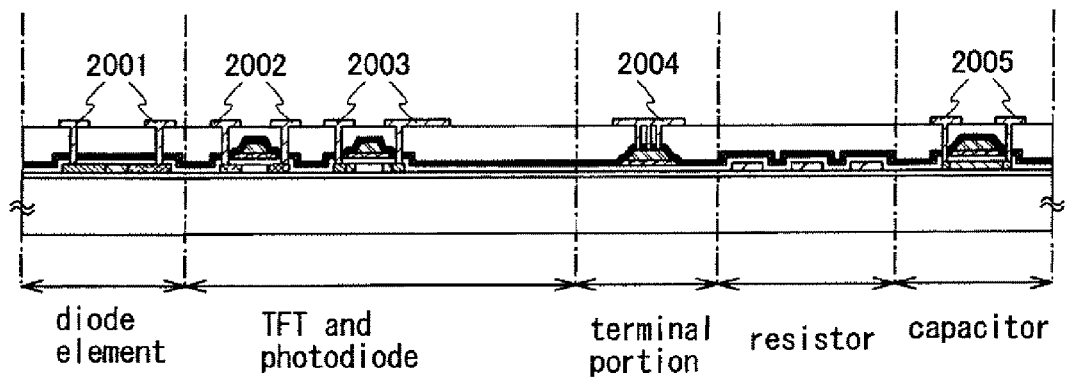

Next, contact holes are formed in the gate insulating film 1907, the insulating film 1911, the insulating film 1912, and the insulating film 1913 so that the semiconductor films 1702*a* to 1702*e* and the first wiring layer 1910 are partly exposed. Then, as illustrated in FIG. 20B, a conductive film 2001 which is in contact with the semiconductor film 1702*a* through the contact hole, a conductive film 2002 which is in contact with the semiconductor film 1702*b* through the contact hole, a conductive film 2003 which is in contact with the semiconductor film 1702*c* through the contact hole, a conductive film 2004 which is in contact with the first wiring layer of the terminal portion through the contact hole, and a conductive film 2005 which is in contact with the semiconductor film 1702*e* through the contact hole are formed. Note that the conductive films 2001 to 2005 illustrated in FIG. 20B serve as a second wiring layer 2006 illustrated in FIG. 20A for electrically connecting the elements in the photoelectric conversion device to each other.

The second wiring layer 2006 can be formed by CVD, sputtering, or the like. Specifically, for the second wiring layer 2006, tungsten (W), titanium (Ti), tantalum (Ta), molybdenum (Mo), nickel (Ni), platinum (Pt), copper (Cu), gold (Au), silver (Ag), manganese (Mn), neodymium (d), carbon (C), silicon (Si), or the like can be used. Alternatively, either an alloy containing the above metal as its main component or a compound containing the above metal may be used. For the second wiring layer 2006, a single-layer film having the above metal or a plurality of stacked films having the above metal can be used.

In particular, titanium, molybdenum, an alloy containing titanium or molybdenum as its main component, or a compound containing titanium or molybdenum is preferably used for the conductive film 2001, the conductive film 2002, the conductive film 2003, and the conductive film 2005 because titanium, molybdenum, the alloy, or the compound has high heat resistance, has a portion which is contact with a semiconductor film of a photodiode formed later and does not easily cause electrolytic corrosion, and can suppress diffusion of a conductive material into the semiconductor film. In this embodiment, a 400-nm-thick titanium film is formed over the insulating film 1913 and is processed to have a desired shape, so that the second wiring layer 2006 is formed.

Figure 21A:
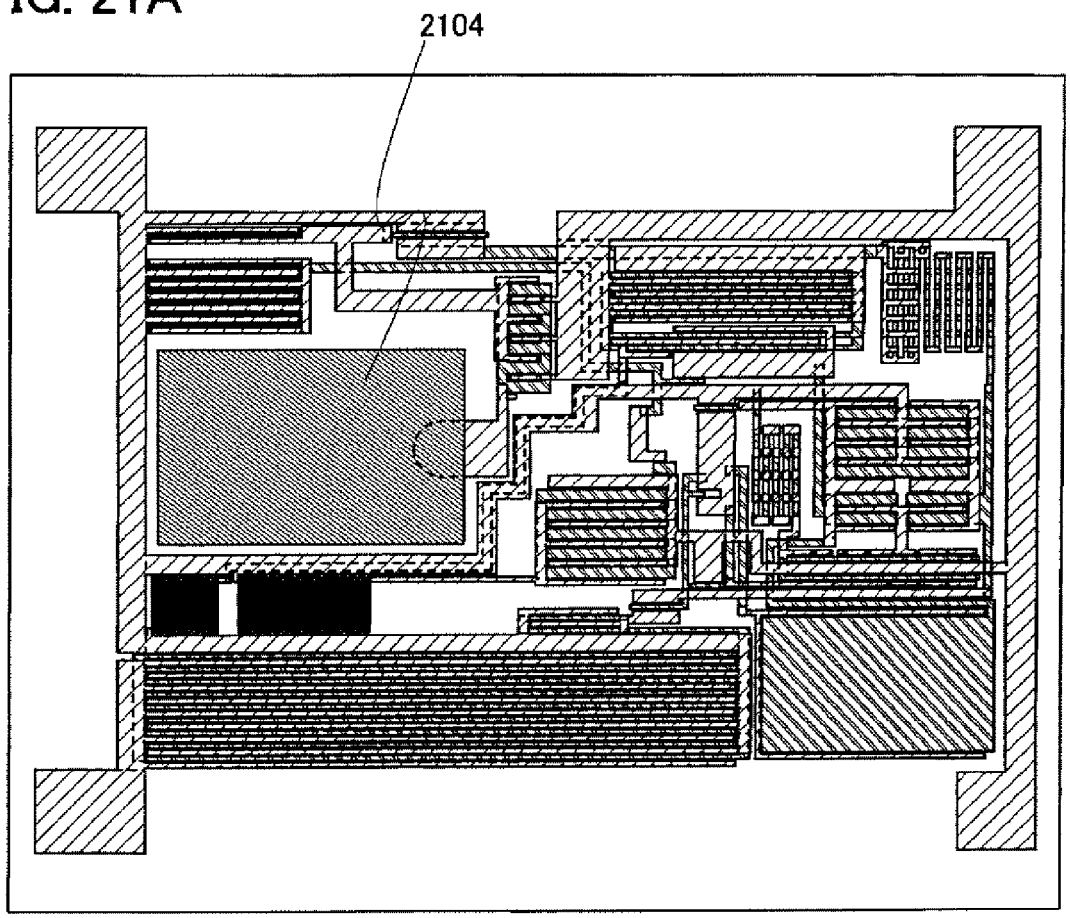
FIGS. 21A and 21B are a top view and a cross-sectional view for illustrating Embodiment 5.
Figure 21B:
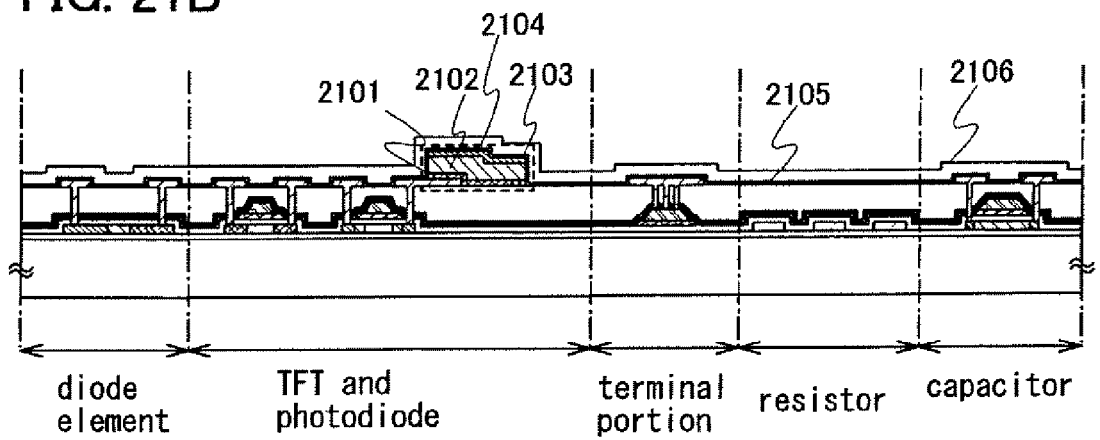

Next, as illustrated in FIGS. 21A and 21B, a semiconductor film 2101 having p-type conductivity, a semiconductor film 2102 having i-type conductivity, and a semiconductor film 2103 having n-type conductivity are sequentially stacked over the insulating film 1913 so as to be in contact with the conductive film 2003, and the semiconductor films which are stacked are each processed to have a desired shape. Accordingly, a photodiode 2104 is formed.

The semiconductor film 2101 having p-type conductivity may be formed by depositing a semi-amorphous (also referred to as microcrystalline or microcrystal) silicon film containing an impurity element which belongs to group 13 of the periodic table, such as boron (B), by plasma-enhanced CVD.

As an example of a method for forming a microcrystalline silicon film, a method by which a microcrystalline silicon film is formed by glow discharge plasma by using a mixed gas of a silane gas, and hydrogen and/or a rare gas can be used. Since silane is diluted 10 to 2000 times with hydrogen and/or a rare gas, a large amount of hydrogen and/or the rare gas is needed. The substrate is heated at a temperature higher than or equal to 100° C. and lower than or equal to 300° C., preferably higher than or equal to 120° C. and lower than or equal to 220° C. In order to promote the growth of microcrystalline silicon, it is preferable that a growth surface of the microcrystalline silicon film be inactivated with hydrogen and deposition be performed at higher than or equal to 120° C. and lower than or equal to 220° C. in deposition treatment, crystals of a SiH radical, a $SiH_2$ radical, and a $SiH_3$ radical, which are active species, are grown from crystal nuclei. Further, energy band width may be adjusted by mixing germanium hydride or germanium fluoride such as $GeH_4$ or $GeF_4$ into gas such as silane or by adding carbon or germanium to silicon. In the case of adding carbon to silicon, the energy band width becomes wider. On the other hand, in the case of adding germanium to silicon, the energy band width becomes narrower.

As the i-type semiconductor film 2102, for example, a microcrystalline silicon film may be formed by plasma-enhanced CVD. Note that an i-type semiconductor refers to a semiconductor in which the concentration of an impurity which imparts p-type conductivity or n-type conductivity, which is included in the semiconductor, is lower than or equal to $1 \times 10^{20}$ cm$^{-3}$, the concentration of oxygen and nitrogen is lower than or equal to $1 \times 10^{20}$ cm$^{-3}$, and photoconductivity is 100 times or more than dark conductivity. The i-type semiconductor also includes a semiconductor containing an impurity element which belongs to Group 13 or Group 15 of the periodic table in its category. That is, the i-type semiconductor has weak n-type electric conductivity when an impurity element for controlling valence electrons is not added intentionally. Therefore, the i-type semiconductor includes a semiconductor to which an impurity which imparts p-type conductivity is added intentionally or unintentionally at the same time of deposition or after the deposition in its category.

In addition, as the n-type semiconductor film 2103, a microcrystalline silicon film containing an impurity element which belongs to Group 15 of the periodic table, such as phosphorus (P), may be formed, or after forming a microcrystalline silicon film, an impurity element which belongs to Group 15 of the periodic table may be introduced.

Alternatively, for the p-type semiconductor film 2101, the i-type semiconductor film 2102, and the n-type semiconductor film 2103, as well as a microcrystalline semiconductor, an amorphous semiconductor may be used. Alternatively, for the p-type semiconductor film 2101, the i-type semiconductor film 2102, and the n-type semiconductor film 2103, the polycrystalline semiconductor formed by the catalytic element or the laser crystallization may be used. Alternatively, for the p-type semiconductor film 2101, the i-type semiconductor film 2102, and the n-type semiconductor film 2103, a single crystal semiconductor formed by Smart Cut (registered trademark) may be used. In a photodiode formed using a microcrystalline semiconductor or a single crystalline semiconductor, variation in characteristics on a substrate surface can be reduced.

In this embodiment, the photodiode 2104 is formed so that the thickness of the p-type semiconductor film 2101 is 60 nm, the thickness of the i-type semiconductor film 2102 is 400 nm, and the thickness of the n-type semiconductor film 2103 is 80 nm.

Next, as illustrated in FIGS. 21A and 21B, an insulating film 2105 is formed over the insulating film 1913 so as to cover the conductive films 2001 to 2005 and the photodiode 2104. The insulating film 2105 is preferably formed using an insulating film having a high barrier property, which can prevent moisture or an impurity such as an organic substance from being mixed into the photodiode 2104, the p-channel transistor 1902, or the n-channel transistor 1903 from. For example, the insulating film 2105 may be formed using a material such as silicon oxide, silicon nitride, silicon oxynitride, silicon nitride oxide, aluminum nitride, or diamond like carbon (DLC) by CVD, sputtering, or the like. In this embodiment, a 100-nm-thick silicon nitride film formed by CVD is used as the insulating film 2105.

Next, an insulating film 2106 is formed over the insulating film. An organic material having heat resistance, such as acrylic, polyimide, benzocyclobutene, polyamide, or epoxy can be used for the insulating film 2106. As well as such an organic material, a low-dielectric constant material (a low-k material), a siloxane-based resin, silicon oxide, silicon nitride, silicon oxynitride, silicon nitride oxide, phosphosilicate glass (PSG), borophosphosilicate glass (BPSC), alumina, or the like can be used.

In this embodiment, an 800-nm-thick silicon oxide film formed using an organosilane gas by chemical vapor deposition is used as the insulating film 2106. As the organosilane gas, a compound containing silicon, such as tetraethoxysilane (TEOS) (chemical formula: $Si(OC_2H_5)_4$), tetramethylsilane (TMS) (chemical formula; $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Figure 22A:
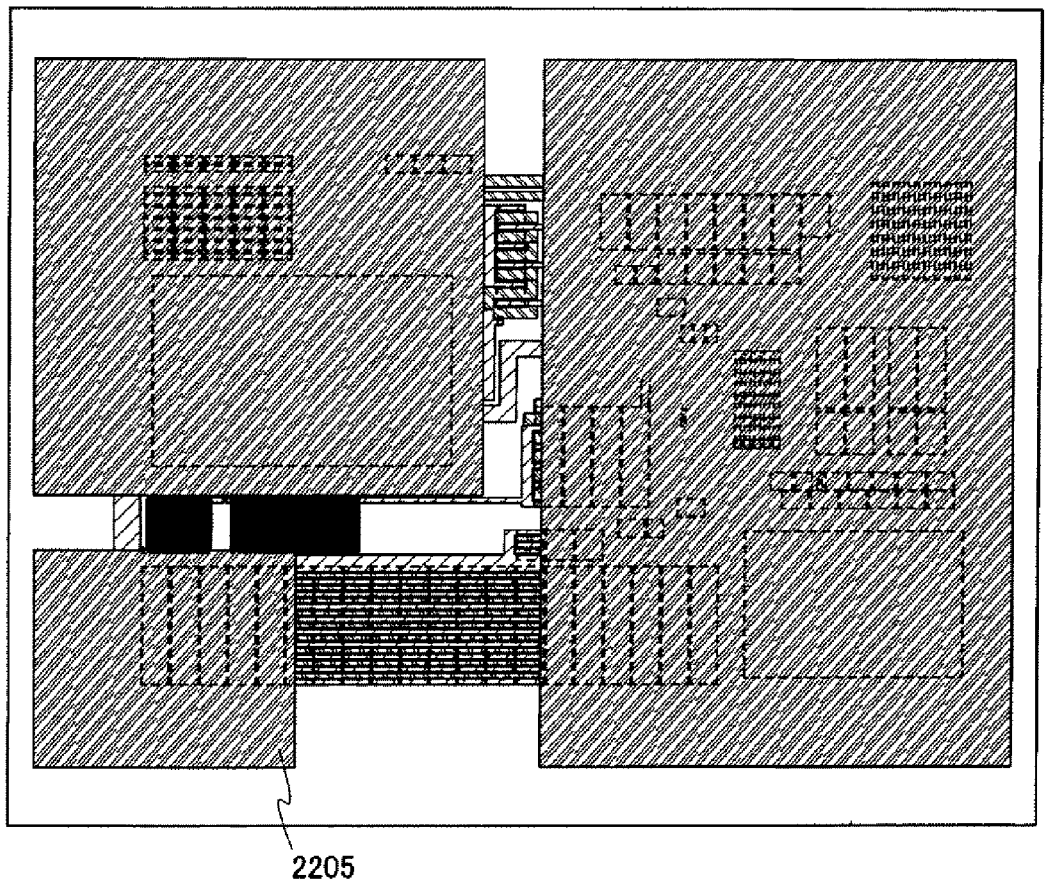
FIGS. 22A and 22B are a top view and a cross-sectional view for illustrating Embodiment 5.
Figure 22B:
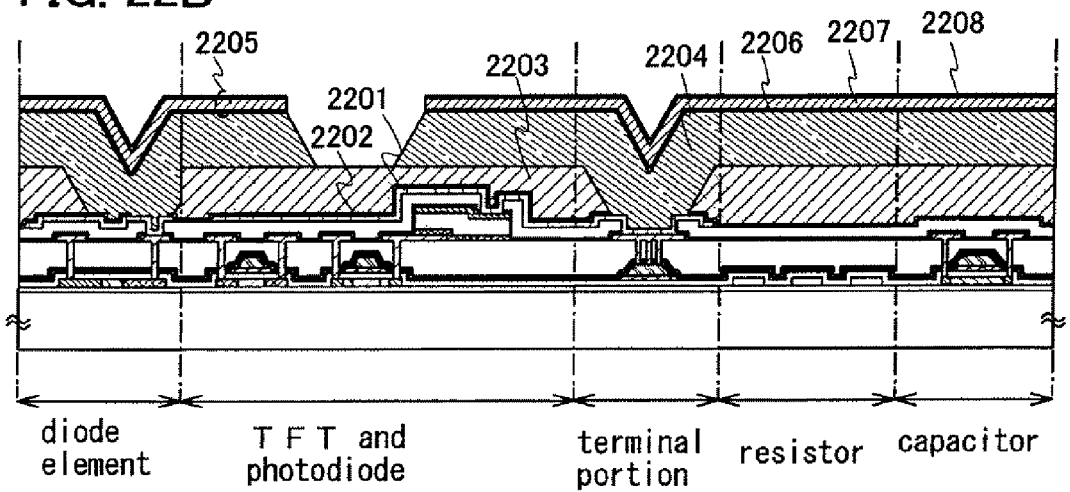

Next, as illustrated in FIGS. 22A and 22B, contact holes are formed in the insulating film 2105 and the insulating film 2106 so that the second wiring layer 2006 and the n-type semiconductor film 2103 which is included in the photodiode 2104 are partly exposed. Then, a conductive film 2201 which is in contact with the second wiring layer 2006 and the n-type semiconductor film 2103 which is included in the photodiode 2104 through the contact hole is formed over the insulating film 2106.

The conductive film 2201 can be formed by CVD, sputtering, or the like. Specifically, for the conductive film 2201, tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, either an alloy containing the above metal as its main component or a compound containing the above metal may be used. For the conductive film 2201, a single-layer film having the above metal or a plurality of stacked films having the above metal can be used.

In particular, titanium, molybdenum, an alloy containing titanium or molybdenum as its main component, or a compound containing titanium or molybdenum is preferably used for the conductive film 2201 because titanium, molybdenum, the alloy, or the compound has high heat resistance, has a portion which is contact with the n-type semiconductor film 2103 and does not easily cause electrolytic corrosion, and can suppress diffusion of a conductive material into the i-type semiconductor film 2102 and the p-type semiconductor film 2101. In this embodiment, a 200-nm-thick titanium film is formed over the insulating film 2106 and is processed to have a desired shape, so that the conductive film 2201 is formed.

Next, as illustrated in FIGS. 22A and 22B, an insulating film 2202 is formed over the insulating film 2106 so as to cover the conductive film 2201. The insulating film 2202 is preferably formed using an insulating film having a high barrier property, which can prevent moisture or an impurity such as an organic substance from being mixed into the photodiode 2104, the p-channel transistor 1902, or the n-channel transistor 1903. For example, the insulating film 2202 may be formed using a material such as silicon oxide, silicon nitride, silicon oxynitride, silicon nitride oxide, aluminum nitride, or diamond like carbon (DLC) by CVD, sputtering, or the like. In this embodiment, a 100-nm-thick silicon nitride film formed by CVD is used as the insulating film 2202.

Next, a sealing film 2203 having a thickness of approximately 1 to 30 µm is formed over the insulating film 2202. By forming the sealing film 2203, semiconductor elements such as the photodiode 2104, the p-channel transistor 1902, and the n-channel transistor 1903 can be protected against external stress. In this embodiment, the 25-µm-thick sealing film 2203 is formed using Ohmcoat (manufactured by NAMICS CORPORATION), which is a photosensitive epoxy-phenol-based resin.

Next, as illustrated in FIGS. 22A and 22B, after the sealing film 2203 is partly removed, a contact hole is formed in the insulating film 2106 so that the second wiring layer 2006 is partly exposed. Then, a conductive film 2204 which is connected to the second wiring layer through the contact hole is formed over the sealing film 2203 by using a conductive paste in which a conductive particle having a crystal grain of several nanometers to several tens of micrometers is dissolved in or dispersed into an organic resin. The conductive film 2204 is formed to a thickness greater than or equal to 1 µm and less than or equal to several tens of micrometers, preferably greater than or equal to 10 µm and less than or equal to 20 µm by a printing method such as screen printing. As the conductive particle, at least one of metal particles of silver (Ag), gold (Au), copper (Cu), nickel (Ni), platinum (Pt), palladium (Pd), tantalum (Ta), molybdenum (Mo), titanium (Ti), and the like or fine particles of silver halide can be used. In addition, as the organic resin included in the conductive paste, one or more selected from organic resins which serve as a binder of metal particles, a solvent, a dispersing agent, and a coating material can be used. Typically, an organic resin such as an epoxy resin or a silicone resin can be used. Further, in the case of forming the conductive film 2204, after the conductive paste is printed, the conductive paste is preferably baked. In this embodiment, the conductive film 2204 is formed using a paste in which nickel is used as a conductive particle so as to have a thickness of approximately 15 µm.

Note that the resin used for the sealing film 2203 and the conductive paste used for the conductive film 2204 include a larger amount of moisture than inorganic insulating films. As described above, by surrounding the photodiode 2104, the p-channel transistor 1902, and the n-channel transistor 1903 with the insulating film 2106 and the insulating film 2202 each having a high barrier property, moisture or an impurity such as an organic substance contained in the resin or the paste can be prevented from being mixed into the photodiode 2104, the p-channel transistor 1902, and the n-channel transistor 1903, which is preferable.

Note that although the conductive film 2204 has favorable flatness because the resin is used, the conductive film 2204 has bad adhesion to a solder. Thus, over the conductive film 2204 formed using a conductive material having favorable adhesion to a solder, an electrode 2205 formed using a conductive material having favorable adhesion to a solder is formed. In this embodiment, for the electrode 2205, a 150-nm-thick titanium film 2206, a 750-nm-thick nickel film 2207, and a 50-nm-thick gold film 2208 are sequentially stacked by sputtering.

Through a series of the above steps, the photoelectric conversion device can be formed.

Note that since a plurality of photoelectric conversion devices are actually formed over a large-area substrate, after a series of the above steps are finished, the substrate is cut by dicing, laser cutting, or the like so that the substrate is cut into separate photoelectric conversion devices.

Before the substrate 1700 is cut, the substrate 1700 may be made thinner by polishing or grinding with a glass polisher, a glass grinder, or the like from a side opposite to a side where the semiconductor elements are formed (a rear side). By making the substrate 1700 thinner, wearing out of a cutting tool used for cutting the substrate 1700 can be reduced. Further, by making the substrate 1700 thinner, the photoelectric conversion device can be made thinner. Note that the substrate 1700 may be made thinner by chemical mechanical polishing. The step of making the substrate 1700 thinner can be performed, for example, after the conductive film 2204 is formed and before the electrode 2205 is formed.

Further, a coloring layer which serves as a color filter may be formed on the rear side of the substrate 1700. Any coloring layer can be used as long as it can preferentially transmit visible light in a particular wavelength range. A resin in which a pigment is dispersed or the like can be used, for example.

Note that the contents described in each drawing in this embodiment can be freely combined with or replaced with the contents described in any of other embodiments as appropriate.

Embodiment 6

In the photoelectric conversion device of the above embodiment, output can be obtained by reducing the adverse effect of fluctuation in the output due to the temperature dependence of a diode element for logarithmic compression, and constant output can be obtained in the case where weak light which is less than the lower limit of detection of the photoelectric conversion element is detected. Thus, an electronic device having the photoelectric conversion device of the above embodiment can detect light in a dark place regardless of changes in external temperature because the electronic device has the photoelectric conversion device as its component. The photoelectric conversion device can be used for display devices, laptops, or image reproducing devices provided with recording media (typically devices which reproduce the content of recording media such as DVDs (digital versatile disc) and have displays for displaying the reproduced images). Further, as electronic devices which can use the photoelectric conversion device of the above embodiment, there are mobile phones, portable game machines, e-book readers, cameras such as video cameras or digital still cameras, goggle-type displays (head mounted displays), navigation systems, and audio reproducing devices (e.g., car audio equipment or audio component sets). Specific examples of such electronic devices are illustrated in FIGS. 23A and 23B.

Figure 23A:
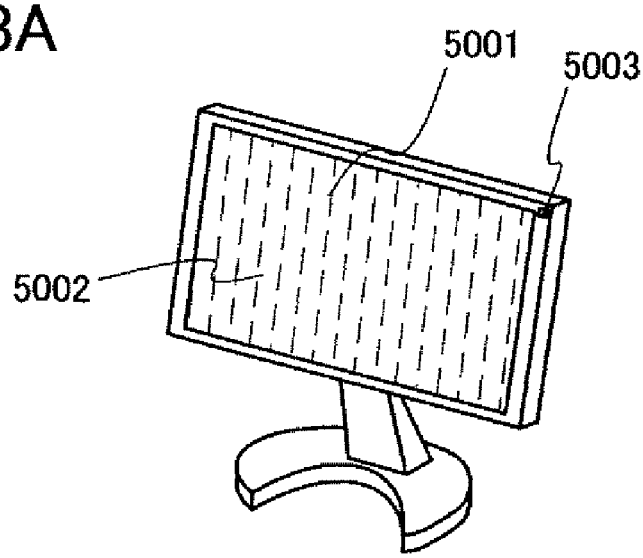
FIGS. 23A and 23B are diagrams for illustrating Embodiment 6.

FIG. 23A illustrates a display device, which includes a housing 5001, a display portion 5002, a sensor portion 5003, and the like. The photoelectric conversion device of the above embodiment can be used for the sensor portion 5003. The sensor portion 5003 detects the intensity of external light. The display device can control the luminance of the display portion 5002 in accordance with the intensity of detected external light. By controlling the luminance of the display portion 5002 in accordance with the intensity of external light, power consumption of the display device can be suppressed. Note that the display device includes all display devices for displaying information, such as display devices for personal computers, for receiving TV broadcast, and for displaying advertisements, in its category.

Figure 23B:
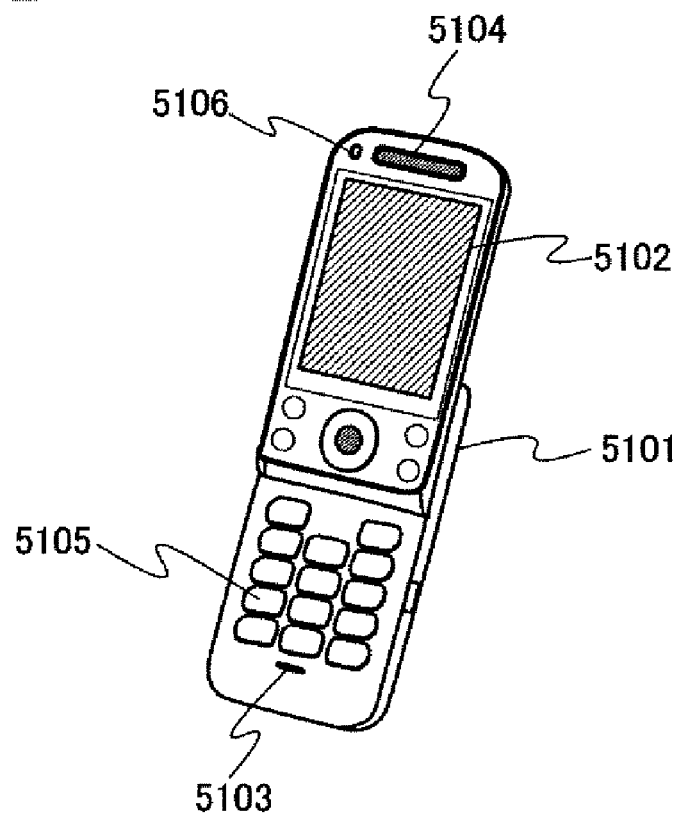

FIG. 23B illustrates a mobile phone, which includes a main body 5101, a display portion 5102, an audio input portion 5103, an audio output portion 5104, operation keys 5105, a sensor portion 5106, and the like. The sensor portion 5106 detects the intensity of external light. The mobile phone can control the luminance of the display portion 5102 or the operation keys 5105 in accordance with the intensity of detected external light. By controlling the luminance of the display portion 5102 or the operation keys 5105 in accordance with the intensity of external light, power consumption of the mobile phone can be suppressed.

Note that the contents described in each drawing in this embodiment can be freely combined with or replaced with the contents described in any of other embodiments as appropriate.

This application is based on Japanese Patent Application serial no. 2008-134663 filed with Japan Patent Office on May 22, 2008, the entire contents of which are hereby incorporated by reference.

What is claimed is:

1. A photoelectric conversion device comprising:
a photoelectric conversion circuit including a photoelectric conversion element and outputting first voltage generated in one of terminals of a first diode element in accordance with an amount of photocurrent generated in the photoelectric conversion element;
a reference voltage generation circuit including a resistor and outputting second voltage generated in one of terminals of a second diode element in accordance with an amount of current flowing to the resistor;
an arithmetic circuit for outputting an output signal obtained by amplifying a difference between a signal corresponding to the first voltage and a signal corresponding to the second voltage; and
an output circuit for outputting current corresponding to the first voltage by the output signal.

2. The photoelectric conversion device according to claim 1, wherein the resistor has a resistance value for supplying current when irradiation with light having illuminance higher than or equal to illuminance which can be detected by the photoelectric conversion element is performed.

3. The photoelectric conversion device according to claim 1, wherein the photoelectric conversion element is a photodiode.

4. The photoelectric conversion device according to claim 1, wherein each of the first diode element and the second diode element is a PIN diode element.

5. The photoelectric conversion device according to claim 1, wherein the first diode element and the second diode element are provided adjacent to each other.

6. A photoelectric conversion device comprising:
a photoelectric conversion circuit including a photoelectric conversion element and outputting first voltage generated in one of terminals of a first diode element in accordance with an amount of photocurrent generated in the photoelectric conversion element;
a reference voltage generation circuit including a resistor and outputting second voltage generated in one of terminals of a second diode element in accordance with an amount of current flowing to the resistor;
an arithmetic circuit including an operational amplifier in which a signal corresponding to the first voltage is input to an inverting input terminal and a signal corresponding to the second voltage is input to a non-inverting input terminal and outputting an output signal from the operational amplifier; and an output circuit for outputting current corresponding to the first voltage by the output signal.

7. The photoelectric conversion device according to claim 6, wherein the resistor has a resistance value for supplying current when irradiation with light having illuminance higher than or equal to illuminance which can be detected by the photoelectric conversion element is performed.

8. The photoelectric conversion device according to claim 6, wherein the photoelectric conversion element is a photodiode.

9. The photoelectric conversion device according to claim 6, wherein each of the first diode element and the second diode element is a PIN diode element.

10. The photoelectric conversion device according to claim 6, wherein the first diode element and the second diode element are provided adjacent to each other.

11. A photoelectric conversion device comprising:
a photoelectric conversion circuit including a photoelectric conversion element and outputting first voltage generated in one of terminals of a first diode element in accordance with an amount of photocurrent generated in the photoelectric conversion element;
a reference voltage generation circuit including a resistor and outputting second voltage generated in one of terminals of a second diode element in accordance with an amount of current flowing to the resistor;
an arithmetic circuit including an operational amplifier in which a signal corresponding to the first voltage is input to an inverting input terminal and a signal corresponding to the second voltage is input to a non-inverting input terminal and outputting an output signal from the operational amplifier;
a current mirror circuit; and
an output circuit,
wherein the output circuit includes an n-channel transistor and a p-channel transistor;
wherein a first terminal of the n-channel transistor is electrically connected to the current mirror circuit
wherein a second terminal of the n-channel transistor is electrically connected to the inverting input terminal of the operational amplifier,
wherein a first terminal of the p-channel transistor is electrically connected to the inverting input terminal of the operational amplifier,
wherein a second terminal of the p-channel transistor is electrically connected to a wiring for applying a low power supply potential, and
wherein the output circuit switches a conduction state and a non-conduction state by inputting the output signal to a gate of the n-channel transistor and a gate of the p-channel transistor.

12. The photoelectric conversion device according to claim 11, wherein the resistor has a resistance value for supplying current when irradiation with light having illuminance higher than or equal to illuminance which can be detected by the photoelectric conversion element is performed.

13. The photoelectric conversion device according to claim 11, wherein the photoelectric conversion element is a photodiode.

14. The photoelectric conversion device according to claim 1, wherein each of the first diode element and the second diode element is a PIN diode element.

15. The photoelectric conversion device according to claim 11, wherein the first diode element and the second diode element are provided adjacent to each other.

16. A photoelectric conversion device comprising:
a photoelectric conversion circuit including a photoelectric conversion element and outputting first voltage generated in one of terminals of a first diode element in accordance with an amount of photocurrent generated in the photoelectric conversion element;
a reference voltage generation circuit including a resistor and outputting second voltage generated in one of terminals of a second diode element in accordance with an amount of current flowing to the resistor;
a first amplifier circuit for amplifying the first voltage;
a second amplifier circuit for amplifying the second voltage;
an arithmetic circuit including an operational amplifier in which the amplified first voltage is input to an inverting input terminal and the amplified second voltage is input to a non-inverting input terminal and outputting an output signal from the operational amplifier;
a current mirror circuit, and
an output circuit,
wherein the output circuit includes an n-channel transistor and a p-channel transistor,
wherein a first terminal of the n-channel transistor is electrically connected to the current mirror circuit,
wherein a second terminal of the n-channel transistor is electrically connected to the inverting input terminal of the operational amplifier,
wherein a first terminal of the p-channel transistor is electrically connected to the inverting input terminal of the operational amplifier,
wherein a second terminal of the p-channel transistor is electrically connected to a wiring for applying a low power supply potential,
wherein the output circuit switches a conduction state and a non-conduction state by inputting the output signal to a gate of the n-channel transistor and a gate of the p-channel transistor.

17. The photoelectric conversion device according to claim 16, wherein the other of the terminals of the first diode element and the other of the terminals of the second diode element are electrically connected to a wiring for applying a high power supply potential.

18. The photoelectric conversion device according to claim 16, wherein the resistor has a resistance value for supplying current when irradiation with light having illuminance higher than or equal to illuminance which can be detected by the photoelectric conversion element is performed.

19. The photoelectric conversion device according to claim 16, wherein each of the first amplifier circuit and the second amplifier circuit is formed using a source follower circuit.

20. The photoelectric conversion device according to claim 16, wherein the photoelectric conversion element is a photodiode.

21. The photoelectric conversion device according to claim 16, wherein each of the first diode element and the second diode element is a PIN diode element.

22. The photoelectric conversion device according to a claim 16, wherein the first diode element and the second diode element are provided adjacent to each other.

* * * * *